United States Patent [19]
Murakami et al.

[11] Patent Number: 5,781,351
[45] Date of Patent: Jul. 14, 1998

[54] MOUNTING STRUCTURE OF OBJECTIVE LENS FOR OPTICAL PICK-UP USED FOR OPTICAL DISK DEVICE

[75] Inventors: Yutaka Murakami, Hirakata; Takao Hayashi, Toyonaka; Tomotada Kamei, Takatsuki, all of Japan

[73] Assignee: Matsushita Electric Industrial Co., Ltd., Osaka, Japan

[21] Appl. No.: 657,740

[22] Filed: May 31, 1996

[30] Foreign Application Priority Data

Jun. 2, 1995 [JP] Japan .................... 7-136460
Jul. 11, 1995 [JP] Japan .................... 7-174684

[51] Int. Cl.⁶ ........................................ G02B 7/02
[52] U.S. Cl. ...................... 359/808; 359/819; 396/529
[58] Field of Search ........................ 359/808, 811, 359/819, 820; 396/529

[56] References Cited

U.S. PATENT DOCUMENTS 5,050,963  9/1991  Murakami .................. 359/808
5,177,641  1/1993  Kobayashi .................. 359/820
5,257,145  10/1993  Kanazawa et al. .......... 359/819
5,461,444  10/1995  Okura et al. ............... 396/529

FOREIGN PATENT DOCUMENTS 1-170330  12/1989  Japan.

*Primary Examiner*—Loha Ben
*Attorney, Agent, or Firm*—McDermott, Will & Emery

[57] ABSTRACT

An optical pick-up for use in optical disk devices comprises an objective lens having an outer ring formed therearound and a lens holder for positioning and holding the objective lens, the lens holder having first and second inner walls between which an annular shoulder portion is formed, and plural recesses formed on the annular shoulder portion as reservoirs into which excess adhesive agent is collected when adhesive agent is applied to a gap defined between the first inner wall and the outer ring of the objective lens. Various structures for collecting excess adhesive agent are also disclosed.

15 Claims, 25 Drawing Sheets

MOUNTING STRUCTURE OF OBJECTIVE LENS FOR OPTICAL PICK-UP USED FOR OPTICAL DISK DEVICE

BACKGROUND OF THE INVENTION

1. Field of the Invention

The present invention relates to a mounting or holding structure for an objective lens of an optical pick-up used in optical disk devices such as compact disc players and laser disc players.

2. Description of the Prior Art

FIG. 24 is a block diagram of the structure of an optical pick-up mounted in an optical disk device, and is used below to briefly describe an optical pick-up.

The light beam emitted from a semiconductor laser 1 passes a beam splitter 2 and is incident on an objective lens 4 held in a lens holder 3. The laser beam is concentrated by the objective lens 4 to form a minute beam spot approximately 1 micron in diameter on the recording surface of an optical disk E.

A drive means 5 comprising a piezoelectric element and electromagnetic circuitry is provided in the lens holder 3 to drive the objective lens 4 in the focusing and tracking directions. This drive means 5 makes it possible for the objective lens 4 to track surface fluctuations and eccentricity in the data track of the optical disk E with submicron precision.

The beam reflected from the recording surface of the optical disk E passes back through the objective lens 4, and is reflected perpendicularly by the beam splitter 2 to a pin photodiode 6. The data bits from the optical disk E can then be read based on the intensity of the beam detected by the pin photodiode 6.

Because the objective lens 4 used in this type of optical pick-up focuses the beam emitted from the semiconductor laser 1 to an approximately 1 micron spot, a wavefront aberration of approximately 1/100th the wavelength of the laser beam is required in the objective lens 4, making it important to prevent lens aberrations resulting from distortion introduced by the adhesive.

Momentary gravitational acceleration of up to 100 m/s2 may also be applied to the objective lens 4 in order for the objective lens 4 to track the optical disk E, which rotates at a high speed.

It follows that the support structure for the objective lens 4 must not introduce any optical distortion and must provide sufficient strength.

The material used for the objective lens 4 has conventionally been a glass material with high mechanical strength. Pressure to reduce cost in recent years has, however, driven the development of acrylic and other plastic lens materials. Further innovations in the bonding method have been required in order to assure sufficient mechanical strength and reliability with these plastic lenses. One such method has been to use a large outer ring formed around an optically functional diameter of the objective lens to hold the objective lens 4.

Flowing of the adhesive to the bottom surface of the objective lens 4 is one particular factor that increases the optical aberration of the objective lens, and various designs intending to resolve this problem have been proposed. One of these is the adhesive method for a plastic objective lens having a large outer ring as described in Japanese utility model jikkai H1-170330 (1989-170330). The objective lens holding structure for an optical pick-up according to this prior art is described below with reference to FIG. 25.

FIG. 25 is a side cross section showing the internal structure of the lens holder in an objective lens holding structure for an optical pick-up according to the prior art.

As shown in FIG. 25, the objective lens 4 is held in the lens holder 3. This objective lens 4 is an integral plastic molding of which the top surface 4a and the bottom surface 4b are spherical or aspherical convex surfaces forming lens surfaces. An outer ring 4c is formed at the outside circumference of the spherical surface; a stepped lens positioning wall 4d is formed below the outer ring 4c.

The lens holder 3 is made from a glass or carbon fiber reinforced plastic molding, and comprises on the inside thereof an aperture 3a constricting the incidence beam to the effective diameter of the objective lens 4. Because of the presence of inside flange 3c, the diameter of the aperture 3a is less than the inside diameter of the bottom aperture 3b. As a result, the diameter of the beam passed through the beam splitter 2 shown in FIG. 24 is reduced by the aperture 3a, and this reduced-diameter beam is incident to the objective lens 4 within the effective diameter of the objective lens 4.

An outside wall 7 is also formed in a ring around the top of the aperture 3a in this conventional lens holder 3. The position of the objective lens 4 is thus determined by the inside circumference of the outside wall 7 and the lens positioning wall 4d, and the outside circumference of the outside wall 7 and the outside circumference of the outer ring 4c are bonded together by an adhesive 8.

The problem with the construction described above is that a small space results between the top of the outside wall 7 and the bottom of the outer ring 4c, and flowing of the adhesive to the bottom of the outer ring 4c cannot be sufficiently suppressed. To reduce the effects of this gap and adhesive flow, the size of the outer ring 4c is expanded outside the curved surfaces functioning as lenses, thus increasing the diameter of the objective lens. This obviously impedes reducing the size and height (profile) of the optical disk device.

SUMMARY OF THE INVENTION

An object of the present invention is therefore to provide a structure for holding the objective lens of an optical pick-up, and specifically to provide a holding structure introducing no optical aberrations and offering excellent reliability even when bonding a small objective lens having a small outer ring.

To achieve this object, the objective lens holding structure for an optical pick-up according to the present invention comprises an objective lens having an outer ring with a flat surface around the outside circumference of the lens curvature, and a lens holder. The lens holder comprises a hole to which the objective lens is inserted, and comprises in the bottom of the hole an annular member with plural recesses and an inside diameter greater than the inside circumference of the outer ring. The objective lens is thus inserted to the hole and positioned by the side walls of the hole and the annular member, and the outer ring and lens holder are fastened with adhesive positioned at the recesses.

By means of the configuration thus described, the adhesive may travel along the side walls of the outer ring of the objective lens, flow downward, and collect in the recesses of the annular member. As a result, excess adhesive does not flow to the bottom surface of the objective lens, and optical aberrations in the objective lens caused by shrinking of the adhesive can be prevented even with small objective lenses having small outer ring.

BRIEF DESCRIPTION OF THE DRAWINGS

The present invention will become more fully understood from the detailed description given below and the accompanying diagrams wherein.

DESCRIPTION OF PREFERRED EMBODIMENTS

Figure 1:
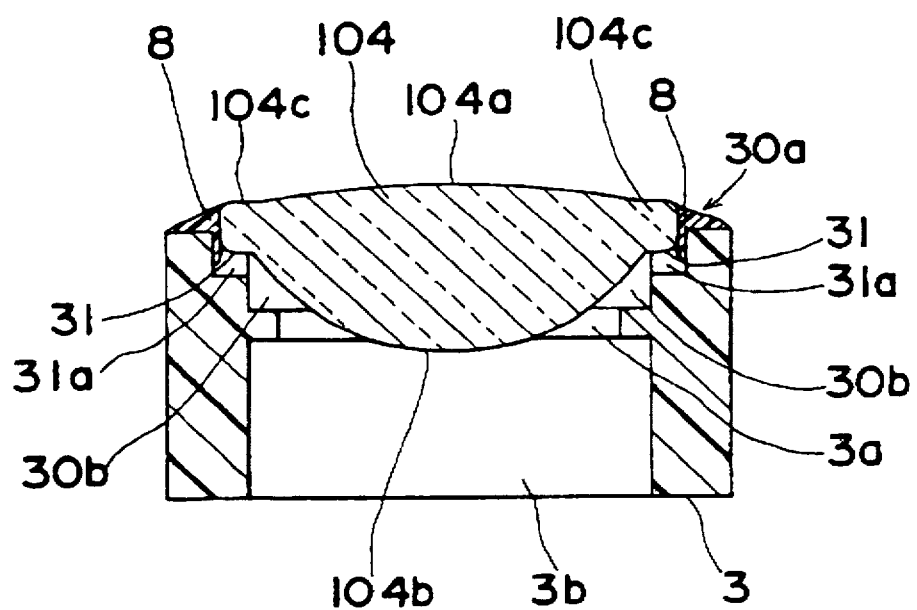
FIG. 1 is a side cross-sectional view of the objective lens holding structure for an optical pick-up according to the first embodiment of the present invention.
Figure 2:
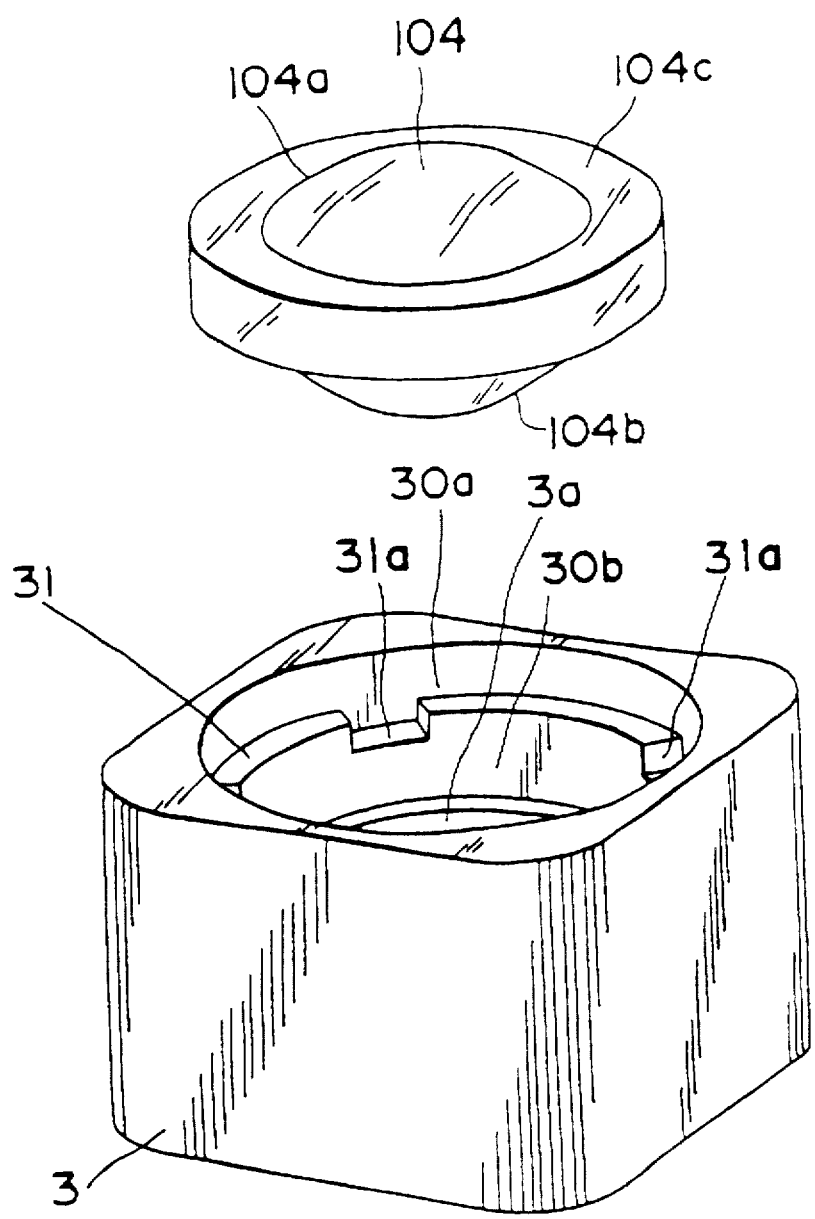
FIG. 2 is a perspective view of the objective lens holding structure shown in FIG. 1.

The preferred embodiments of the present invention are described below with reference to the accompanying figures.
Embodiment 1:

FIG. 1 is a side cross-sectional view of the objective lens holding structure for an optical pick-up according to the first embodiment of the present invention, and FIG. 2 is a perspective view of the objective lens holding structure shown in FIG. 1. Note that components providing the same function as in the prior art example shown in FIGS. 24 and 25 are identified by like references.

Figure 24:
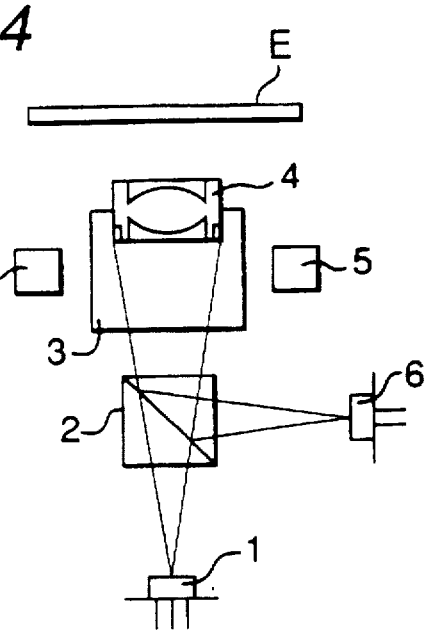
FIG. 24 is a block diagram of the structure of a conventional optical pick-up.
Figure 25:
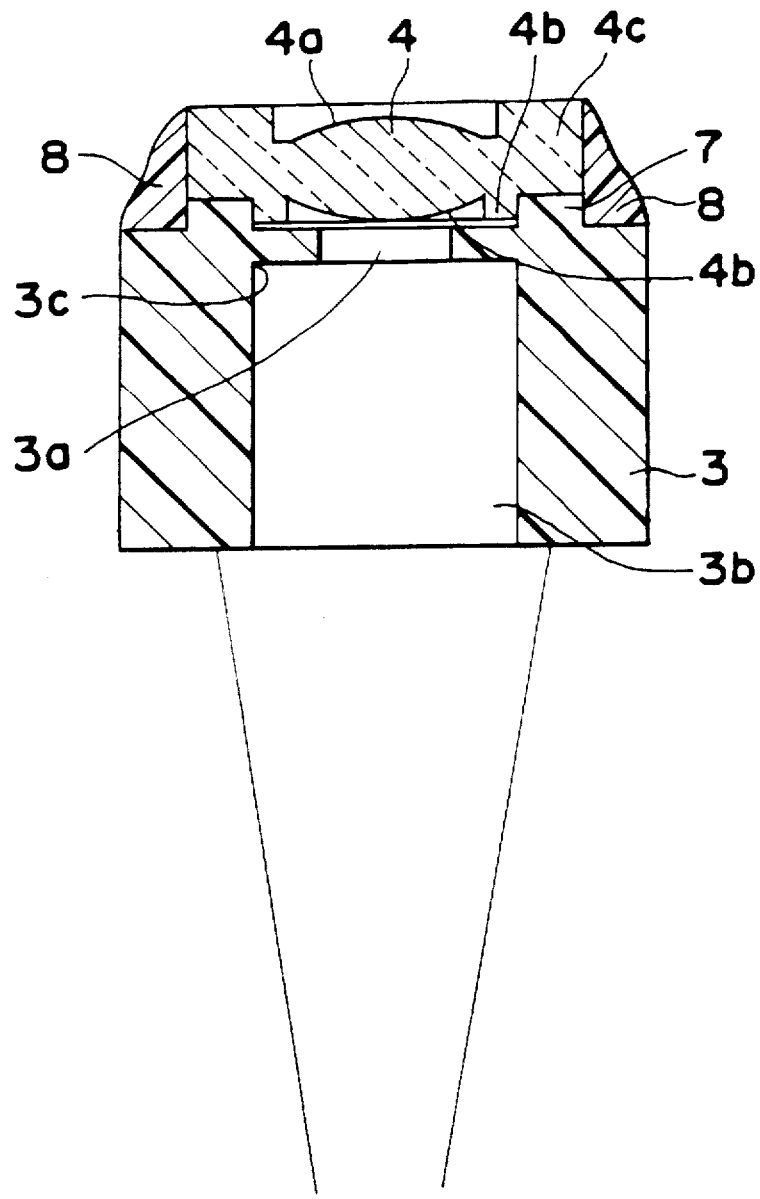
FIG. 25 is a side cross-sectional view showing the internal structure of the lens holder in an objective lens holding structure for an optical pick-up according to the prior art.

Referring to FIGS. 1 and 2, a small objective lens 104 focuses a laser beam passed through the beam splitter 2 shown in FIG. 24 to form a small light spot on the recording surface of the optical disk E.

The objective lens 104 is a biconvex lens comprising spherical or aspherical convex top and bottom lens surfaces 104a and 104b, respectively. An outer ring 104c is formed at the outside circumference of the lens surfaces with flat top and bottom surfaces as shown in FIG. 2.

The lens holder 3 comprises a lens insertion hole 30a to which the small objective lens 104 is inserted, and a center hole 30b providing clearance for the convex surface of the bottom lens surface 104b.

An annular member 31 disposed inside the lens insertion hole 30a comprises recesses 31a diagonally opposed to each other in the top of the annular member 31 at the four corners of the lens holder 3. These recesses 31a correspond to the adhesion points of the small objective lens 104, and form reservoirs in which excess adhesive 8 can overflow and collect.

The method of positioning and fastening the small objective lens 104 in the lens holder 3 is described next.

When the small objective lens 104 is inserted to the lens insertion hole 30a, the bottom lens surface 104b enters the center hole 30b, the bottom of the outer ring 104c contacts the top of the annular member 31, and the position of the small objective lens 104 to the lens holder 3 is thus determined by the lens insertion hole 30a and the annular member 31. The adhesive 8 is then applied to the side of the outer ring 104c of the small objective lens 104 across the top of the lens holder 3 at the four corners of the lens holder 3 to which the recesses 31a are provided.

Any excess adhesive 8 flowing through the gap between the outer ring 104c and the lens insertion hole 30a toward the bottom of the small objective lens 104 thus collects in the recesses 31a.

With the objective lens holding structure for an optical pick-up according to the present invention as thus described, recesses 31a are formed at diagonally opposing positions at the four corners of the lens holder 3 above the annular member 31 formed in the bottom of the lens insertion hole 30a. The adhesive 8 is then applied at the side of the outer ring 104c and the top four corners of the lens holder 3 to fasten the small objective lens 104 by adhesion. Excess adhesive 8 thus collects in the recesses 31a, thereby preventing the adhesive from flowing to the bottom of the outer ring 104c, and thus preventing further deterioration of the lens aberrations of the small objective lens 104.
Embodiment 2:

The second embodiment of the present invention is described below with reference to the accompanying FIG. 3, a side cross-sectional view of the objective lens holding structure for an optical pick-up according to the second embodiment of the present invention, and FIG. 4, a perspective view of the objective lens holding structure shown in FIG. 3.

Note that components providing the same function as in the prior art example shown in FIGS. 24 and 25, and the preceding embodiment shown in FIGS. 1 and 2 are identified by like references.

Figure 3:
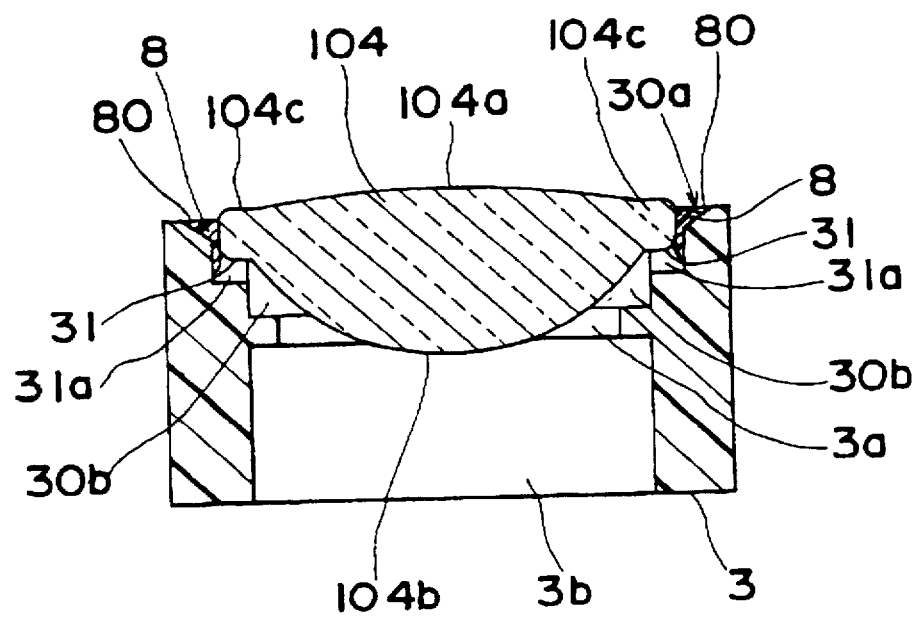
FIG. 3 is a side cross-sectional view of the objective lens holding structure for an optical pick-up according to the second embodiment of the present invention.
Figure 4:
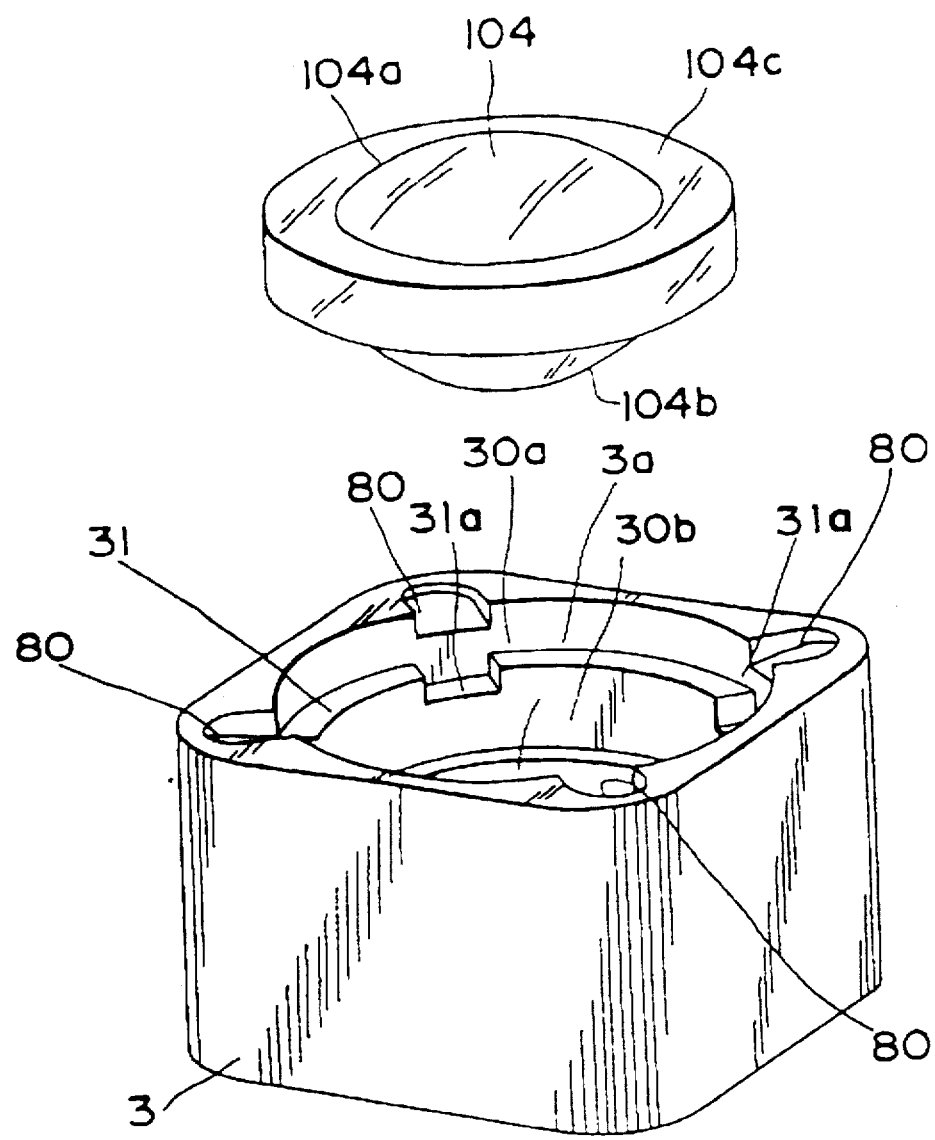
FIG. 4 is a perspective view of the objective lens holding structure shown in FIG. 3.

What differs between the configuration shown in FIGS. 3 and 4 and that in FIG. 1 is the provision of adhesive channels 80 in the top of the lens holder 3 at the four corners corresponding to the positions of the recesses 31a. Note that the bottom of these adhesive channels 80 slopes downward and inward toward the lens insertion hole 30a.

The method of positioning and fastening the small objective lens 104 in the lens holder 3 is described next.

When the small objective lens 104 is inserted to the lens insertion hole 30a, the bottom lens surface 104b enters the center hole 30b, the bottom of the outer ring 104c contacts the top of the annular member 31, and the position of the small objective lens 104 to the lens holder 3 is thus determined by the lens insertion hole 30a and the annular member 31. The adhesive 8 is then injected to the adhesive channels 80 to bond the small objective lens 104 in place.

Any excess adhesive 8 injected to the adhesive channels 80 and flowing through the gap between the outer ring 104c and the lens insertion hole 30a toward the bottom of the small objective lens 104 thus collects in the recesses 31a.

In addition to the effects obtained by the first embodiment above, unnecessary spreading of the adhesive 8 to the sides of the outer ring 104c can be prevented by forming adhesive channels 80 sloping downward and inward toward the lens insertion hole 30a at the four corners of the lens holder 3 corresponding to the positions of the recesses 31a according to the objective lens holding structure for an optical pick-up according to the present embodiment as thus described.

It should be noted that while the bottoms of the adhesive channels 80 are described as sloping in this embodiment, it is also possible to make said bottoms flat with a wall around the flat bottoms, thereby achieving the same effect as reservoirs for excess adhesive.

Embodiment 3:

The third embodiment of the present invention is described below with reference to the accompanying FIG. 5, a side cross-sectional view of the objective lens holding structure for an optical pick-up according to the third embodiment of the present invention, and FIG. 6, a perspective view of the objective lens holding structure shown in FIG. 5.

Note that components providing the same function as in the prior art example shown in FIGS. 24 and 25, and the preceding embodiment shown in FIGS. 1 and 2 are identified by like references.

What differs between the configuration shown in FIGS. 3 and 4 and that in FIG. 1 is the provision of sloping adhesive channels 80 in the top of the lens holder 3 at the four corners corresponding to the positions of the recesses 31a, and wide recesses 310 in the top of the annular member 31 with a width greater than the channel width of the adhesive channels 80. The specific difference is thus the formation of adhesive channels 80 narrower in width than the wide recesses 310 provided as adhesive reservoirs.

The method of positioning and fastening the small objective lens 104 in the lens holder 3 is described next.

When the small objective lens 104 is inserted to the lens insertion hole 30a, the bottom lens surface 104b enters the center hole 30b, the bottom of the outer ring 104c contacts the top of the annular member 31, and the position of the small objective lens 104 to the lens holder 3 is thus determined by the lens insertion hole 30a and the annular member 31. The adhesive 8 is then injected to the adhesive channels 80 to bond the small objective lens 104 in place.

Any excess adhesive 8 injected to the adhesive channels 80 and flowing through the gap between the outer ring 104c and the lens insertion hole 30a toward the bottom of the small objective lens 104 thus collects in the wide recesses 310.

In addition to the effects obtained by the first and second embodiments above, adhesive 8 that has spread between the outer ring 104c and the lens insertion hole 30a can thus be prevented from flowing to the bottom of the outer ring 104c by providing in the annular member 31 wide recesses 310 that are wider than the channel width of the adhesive channels 80 according to the objective lens holding structure for an optical pick-up according to the present embodiment as thus described.

Embodiment 4:

The fourth embodiment of the present invention is described below with reference to the accompanying FIG. 7, a side cross-sectional view of the objective lens holding structure for an optical pick-up according to the fourth embodiment of the present invention, and FIG. 8, a perspective view of the objective lens holding structure shown in FIG. 7.

Note that components providing the same function as in the prior art example shown in FIGS. 24 and 25, and the preceding embodiments shown in FIGS. 1–6 are identified by like references.

Figure 5:
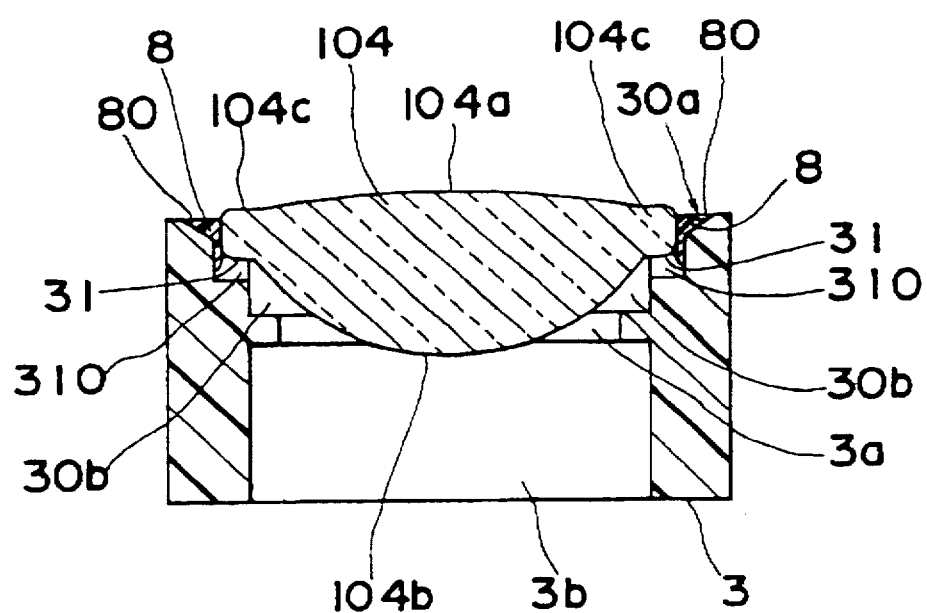
FIG. 5 is a side cross-sectional view of the objective lens holding structure for an optical pick-up according to the third embodiment of the present invention.
Figure 6:
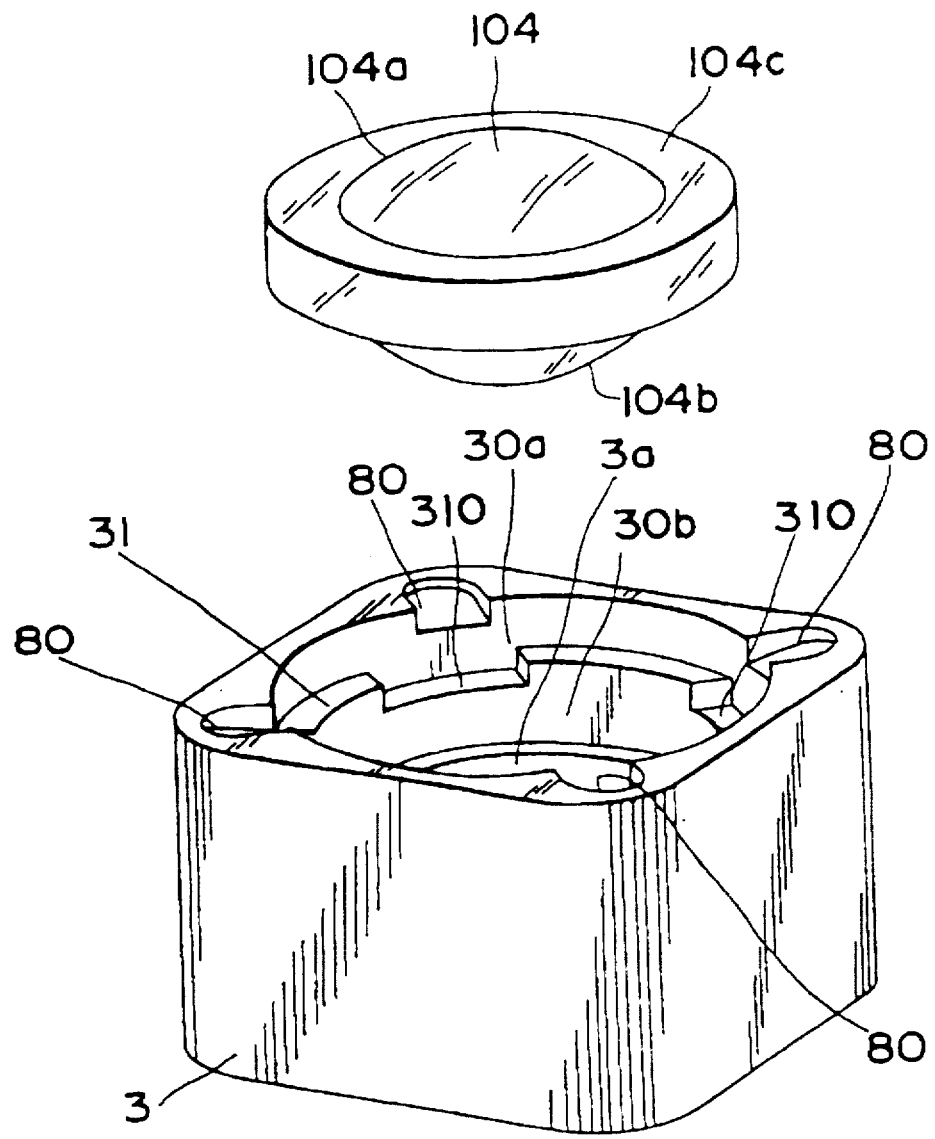
FIG. 6 is a perspective view of the objective lens holding structure shown in FIG. 5.
Figure 7:
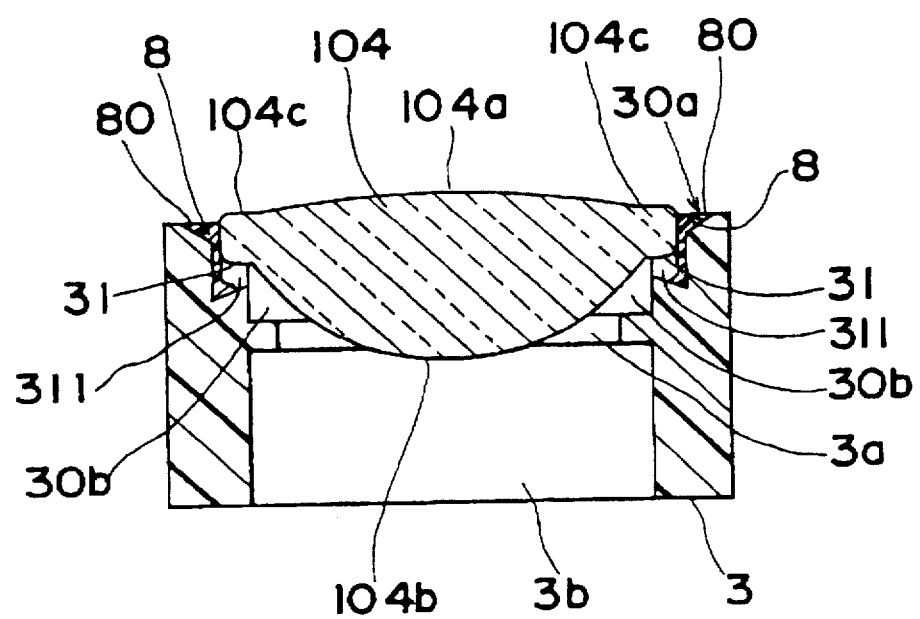
FIG. 7 is a side cross-sectional view of the objective lens holding structure for an optical pick-up according to the fourth embodiment of the present invention.
Figure 8:
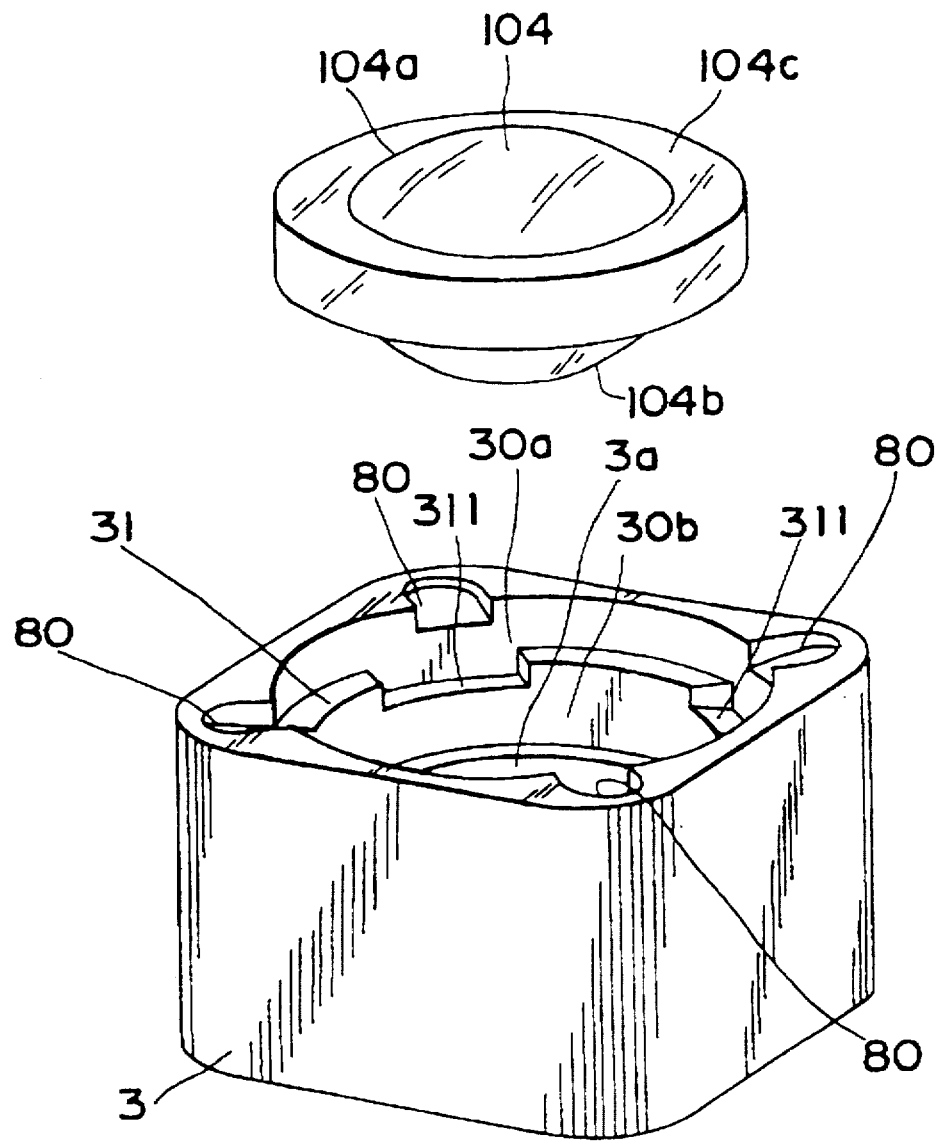
FIG. 8 is a perspective view of the objective lens holding structure shown in FIG. 7.

As shown in FIGS. 7 and 8, adhesive channels 80 sloping downward and inward toward the lens insertion hole 30a are provided at the four corners of the lens holder 3 as in the embodiment shown in FIGS. 5 and 6. What differs from FIGS. 5 and 6 is the structure of the recesses 311 disposed in the annular member 31 to the positions of the adhesive 8. Specifically, the bottom of said recesses 311 slopes away from the center hole 30b in the direction of the outside circumference.

The method of positioning and fastening the small objective lens 104 in the lens holder 3 is described next.

When the small objective lens 104 is inserted to the lens insertion hole 30a, the bottom lens surface 104b enters the center hole 30b, the bottom of the outer ring 104c contacts the top of the annular member 31, and the position of the small objective lens 104 to the lens holder 3 is thus determined by the lens insertion hole 30a and the annular member 31. The adhesive 8 is then injected to the adhesive channels 80 to bond the small objective lens 104 in place.

Any excess adhesive 8 injected to the adhesive channels 80 and flowing through the gap between the outer ring 104c and the lens insertion hole 30a toward the bottom of the small objective lens 104 thus collects in the sloping recesses 311. Because the bottom of said recesses 311 slopes away from the center hole 30b in the direction of the outside circumference, the adhesive 8 will not flow into the center hole 30b or the aperture 3a.

In addition to the effects obtained by the first to third embodiments above, excess adhesive 8 flowing down through the gap between the outer ring 104c and the lens insertion hole 30a can be prevented from flowing into the center hole 30b or the aperture 3a by providing in the annular member 31 at positions corresponding to the adhesive channels 80 sloping recesses 311 of which the bottom is inclined towards the outside circumference according to the objective lens holding structure for an optical pick-up according to the present embodiment as thus described.

As a result, a light spot is thus obtained with a constant and stable beam diameter constricted by the aperture 3a and incident on the small objective lens 104.

Figure 9:
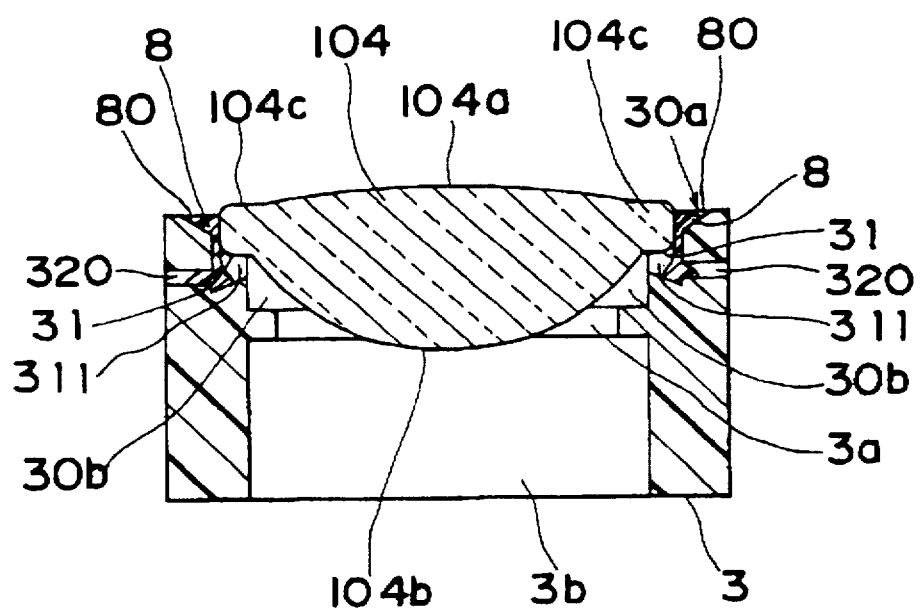
FIG. 9 is a side cross-sectional view of the objective lens holding structure for an optical pick-up according to the fifth embodiment of the present invention.
Figure 10:
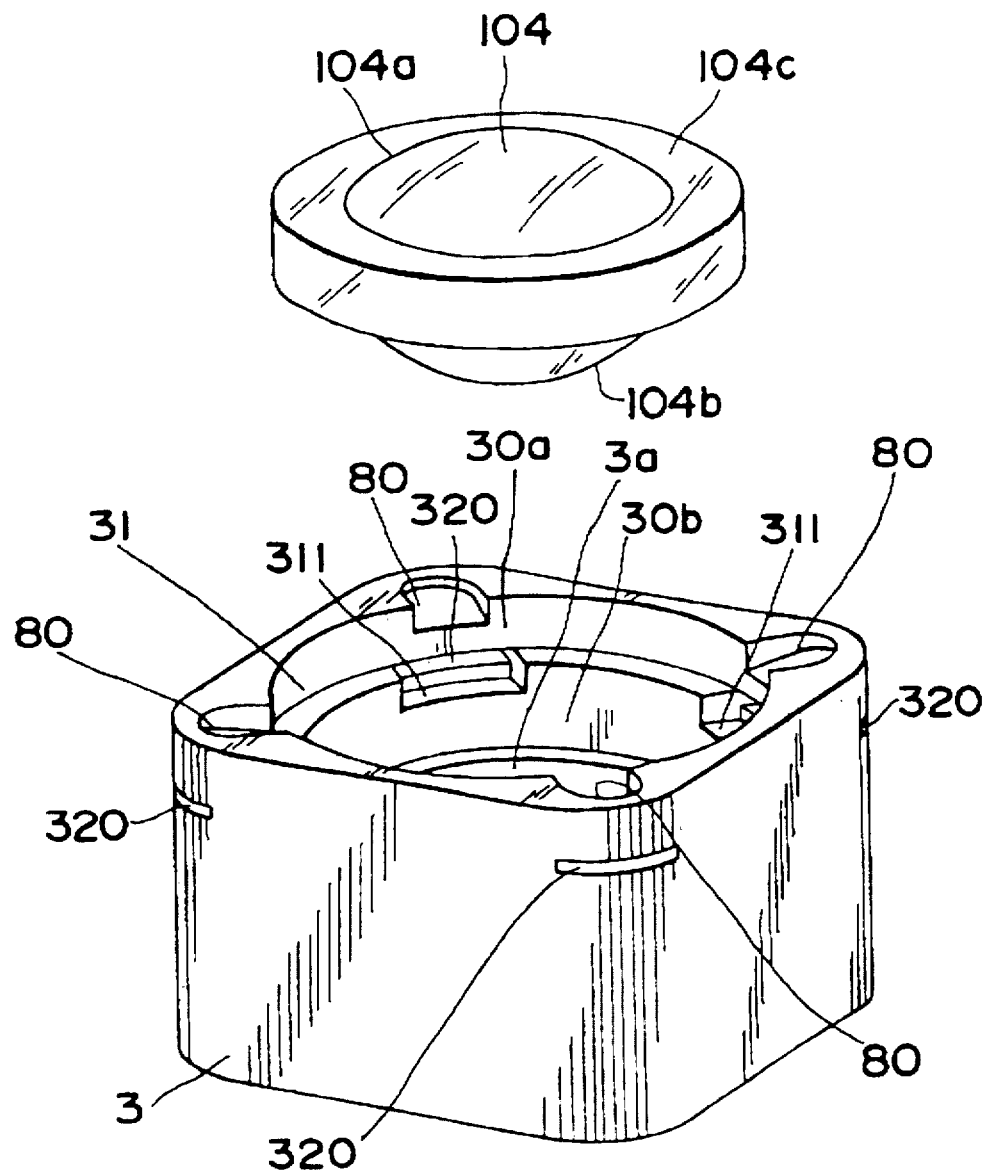
FIG. 10 is a perspective view of the objective lens holding structure shown in FIG. 9.

Embodiment 5:

The fifth embodiment of the present invention is described below with reference to the accompanying FIG. 9, a side cross-sectional view of the objective lens holding structure for an optical pick-up according to the fourth embodiment of the present invention, and FIG. 10, a perspective view of the objective lens holding structure shown in FIG. 9.

Note that components providing the same function as in the prior art example shown in FIGS. 24 and 25, and the preceding embodiments shown in FIGS. 1–8 are identified by like references.

As in the preceding embodiment shown in FIGS. 7 and 8, adhesive channels 80 sloping downward and inward toward the lens insertion hole 30a are provided at the four corners of the lens holder 3, and recesses 311 disposed in the annular member 31 to the positions of the adhesive 8 have a bottom sloping away from the center hole 30b in the direction of the outside circumference. What differs in this embodiment is the provision of horizontal slots 320 in the outside walls of the sloping recesses 311. The purpose of these horizontal slots 320 is to bleed excess adhesive 8 collecting in the sloping recesses 311 outside the lens holder 3.

The method of positioning and fastening the small objective lens 104 in the lens holder 3 is described next.

When the small objective lens 104 is inserted to the lens insertion hole 30a, the bottom lens surface 104b enters the center hole 30b, the bottom of the outer ring 104c contacts the top of the annular member 31, and the position of the small objective lens 104 to the lens holder 3 is thus determined by the lens insertion hole 30a and the annular member 31. The adhesive 8 is then injected to the adhesive channels 80 to bond the small objective lens 104 in place.

Any excess adhesive 8 injected to the adhesive channels 80 and flowing through the gap between the outer ring 104c and the lens insertion hole 30a toward the bottom of the small objective lens 104 thus collects in the sloping recesses 311. When the amount of collected adhesive exceeds the holding capacity of the sloping recess 311, any excess can flow through the horizontal slots 320 outside the lens holder 3.

In addition to the effects obtained by the first to fourth embodiments above, excess adhesive 8 exceeding the capacity of the sloping recesses 311 when bonding the small objective lens 104 can flow outside the lens holder 3 by providing horizontal slots 320 in the outside walls of the sloping recesses 311, the bottoms of which are inclined to the outside, according to the objective lens holding structure for an optical pick-up according to the present embodiment as thus described.

It is therefore easier to control the amount of adhesive applied, and a small objective lens 104 can be easily bonded in place.

Embodiment 6:

The sixth embodiment of the present invention is described below with reference to the accompanying FIG. 11, a side cross-sectional view of the objective lens holding structure for an optical pick-up according to the fourth embodiment of the present invention, and FIG. 12, a perspective view of the objective lens holding structure shown in FIG. 11.

Note that components providing the same function as in the prior art example shown in FIGS. 24 and 25, and the preceding embodiments shown in FIGS. 1–10 are identified by like references.

As in the preceding embodiment shown in FIGS. 7 and 8, adhesive channels 80 sloping downward and inward toward the lens insertion hole 30a are provided at the four corners of the lens holder 3, and recesses 311 disposed in the annular member 31 to the positions of the adhesive 8 have a bottom sloping away from the center hole 30b in the direction of the outside circumference. What differs in this embodiment is the provision of an annular channel 330 around the circumference of the annular member 31.

The method of positioning and fastening the small objective lens 104 in the lens holder 3 is described next.

When the small objective lens 104 is inserted to the lens insertion hole 30a, the bottom lens surface 104b enters the center hole 30b, the bottom of the outer ring 104c contacts the top of the annular member 31, and the position of the small objective lens 104 to the lens holder 3 is thus determined by the lens insertion hole 30a and the annular member 31. The adhesive 8 is then injected to the adhesive channels 80 to bond the small objective lens 104 in place.

It should be noted that a burr sometimes occurs at the edge of the outer ring 104c of the small objective lens 104. This burr is therefore able to enter the annular channel 330, permitting the bottom of the outer ring 104c to positively contact the top of the annular member 31.

In addition to the effects obtained by the first to fourth embodiments above, the bottom surface of the outer ring 104c can be made to positively contact the top surface of the annular member 31 when bonding the small objective lens 104 in place, even if there is an edge burr on the outer ring 104c of the small objective lens 104, by providing an annular channel 330 around the outside circumference of the annular member 31 according to the is objective lens holding structure for an optical pick-up according to the present embodiment as thus described. It is therefore possible to prevent the small objective lens 104 from being bonded at an angle to the lens holder 3.

Embodiment 7:

The seventh embodiment of the present invention is described below with reference to the accompanying FIG. 13, an exploded perspective view of the objective lens holding structure for an optical pick-up according to the seventh embodiment of the present invention, and FIG. 14, a top view of the objective lens holding structure shown in FIG. 13.

Note that components providing the same function as in the prior art example shown in FIGS. 24 and 25, and the preceding embodiments shown in FIGS. 1–12 are identified by like references.

Figure 11:
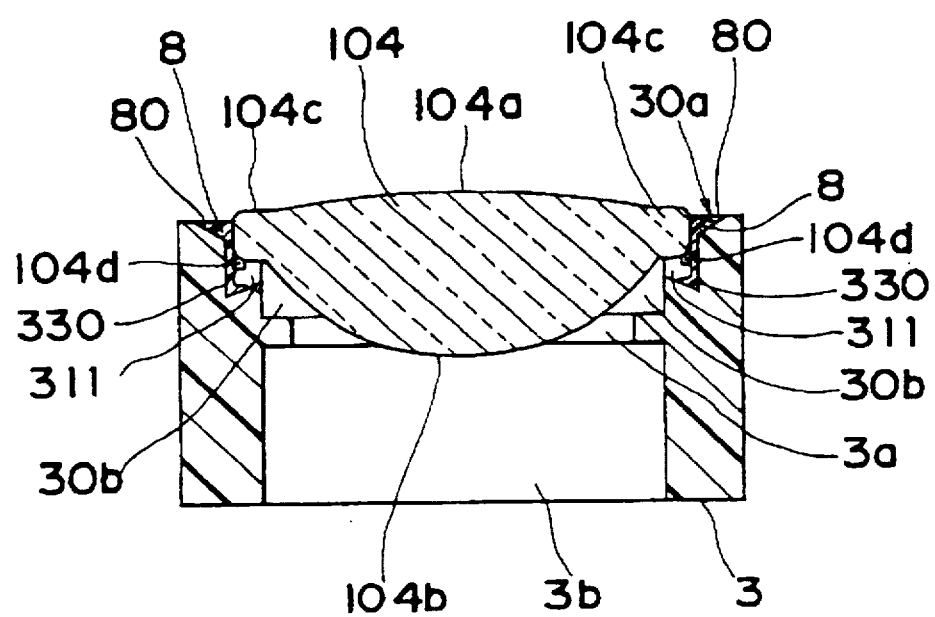
FIG. 11 is a side cross-sectional view of the objective lens holding structure for an optical pick-up according to the sixth embodiment of the present invention.
Figure 12:
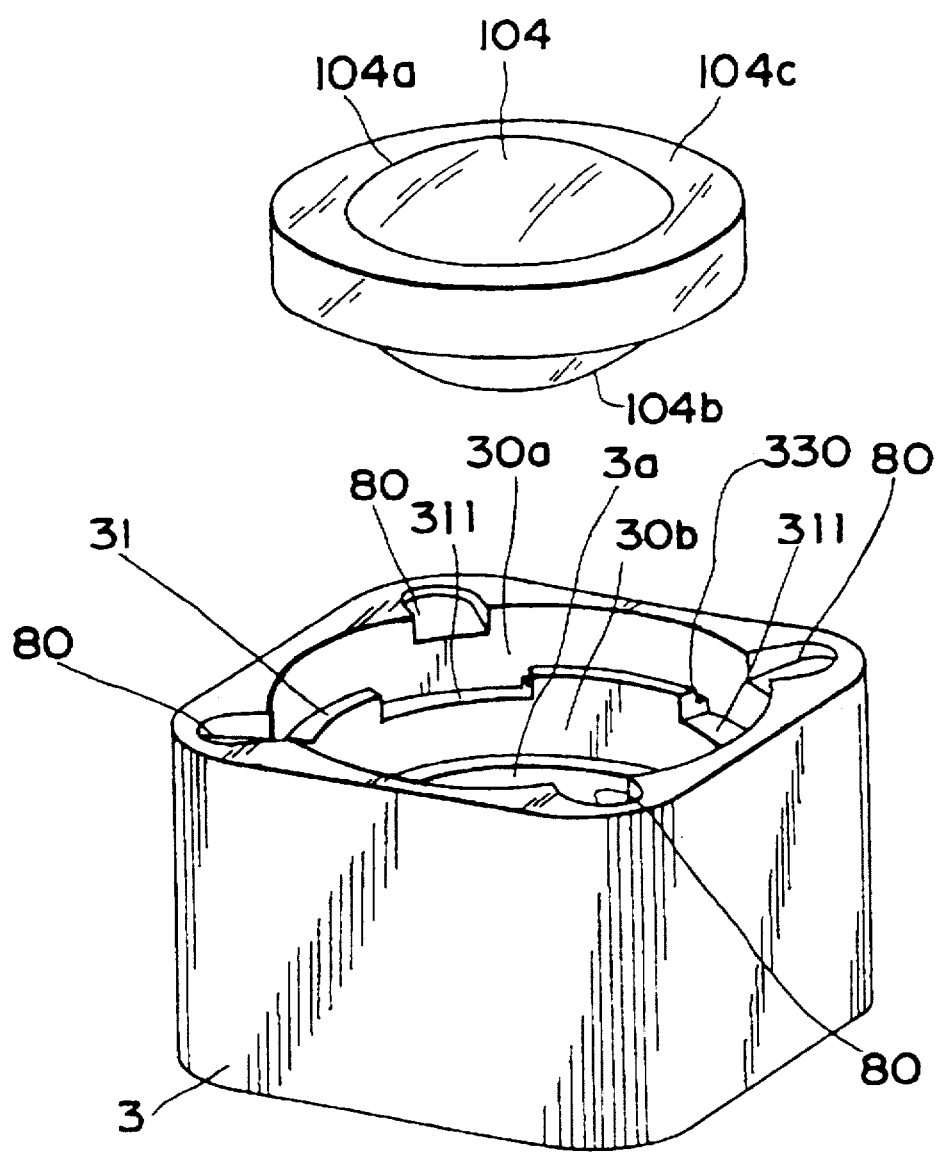
FIG. 12 is a perspective view of the objective lens holding structure shown in FIG. 11.

As in the preceding embodiment shown in FIGS. 11 and 12, adhesive channels 80 sloping downward and inward toward the lens insertion hole 30a are provided at the four corners of the lens holder 3; recesses 311 disposed in the annular member 31 to the positions of the adhesive 8 have a bottom sloping away from the center hole 30b in the direction of the outside circumference; and an annular channel 330 is provided around the circumference of the annular member 31. What differs in this embodiment is the provision of split recess 340 outside the lens insertion hole 30a and in the top of the lens holder 3 to separate the adhesive channels 80 at the four corners. The lens holder 3 thus comprises a lens insertion hole 30a having plural wall sections resulting from the formation of the split recess 340.

The method of positioning and fastening the small objective lens 104 in the lens holder 3 is described next.

When the small objective lens 104 is inserted to the lens insertion hole 30a, the bottom lens surface 104b enters the center hole 30b, the bottom of the outer ring 104c contacts the top of the annular member 31, and the position of the small objective lens 104 to the lens holder 3 is thus determined by the lens insertion hole 30a and the annular member 31. The adhesive 8 is then injected to the adhesive channels 80 to bond the small objective lens 104 in place.

With this configuration, the adhesive 8 injected to the adhesive channels 80 spreads through the gap between the outer ring 104c and the lens insertion hole 30a. The diffusion area (adhesion area) of the adhesive 8 in this case is limited to the divided wall sections of the lens insertion hole 30a because the wall area of the lens insertion hole 30a contacting the side of the outer ring 104c is limited by the split recess 340.

Therefore, in addition to the effects obtained by the first to fourth embodiments and the sixth embodiment above, the adhesion area can be made constant, and the adhesion strength can be made constant, by providing a split recess 340 in the top of the lens holder 3 outside the lens insertion hole 30a to separate the adhesive channels 80 at the four corners as described in the present embodiment of the objective lens holding structure for an optical pick-up according to the present invention.

Embodiment 8:

The eighth embodiment of the present invention is described below with reference to the accompanying FIG. 15, an exploded perspective view of the objective lens holding structure for an optical pick-up according to the eighth embodiment of the present invention, FIG. 16, a perspective view of the objective lens holding structure shown in FIG. 15, and FIG. 17, a side cross-sectional view of the same.

Figure 13:
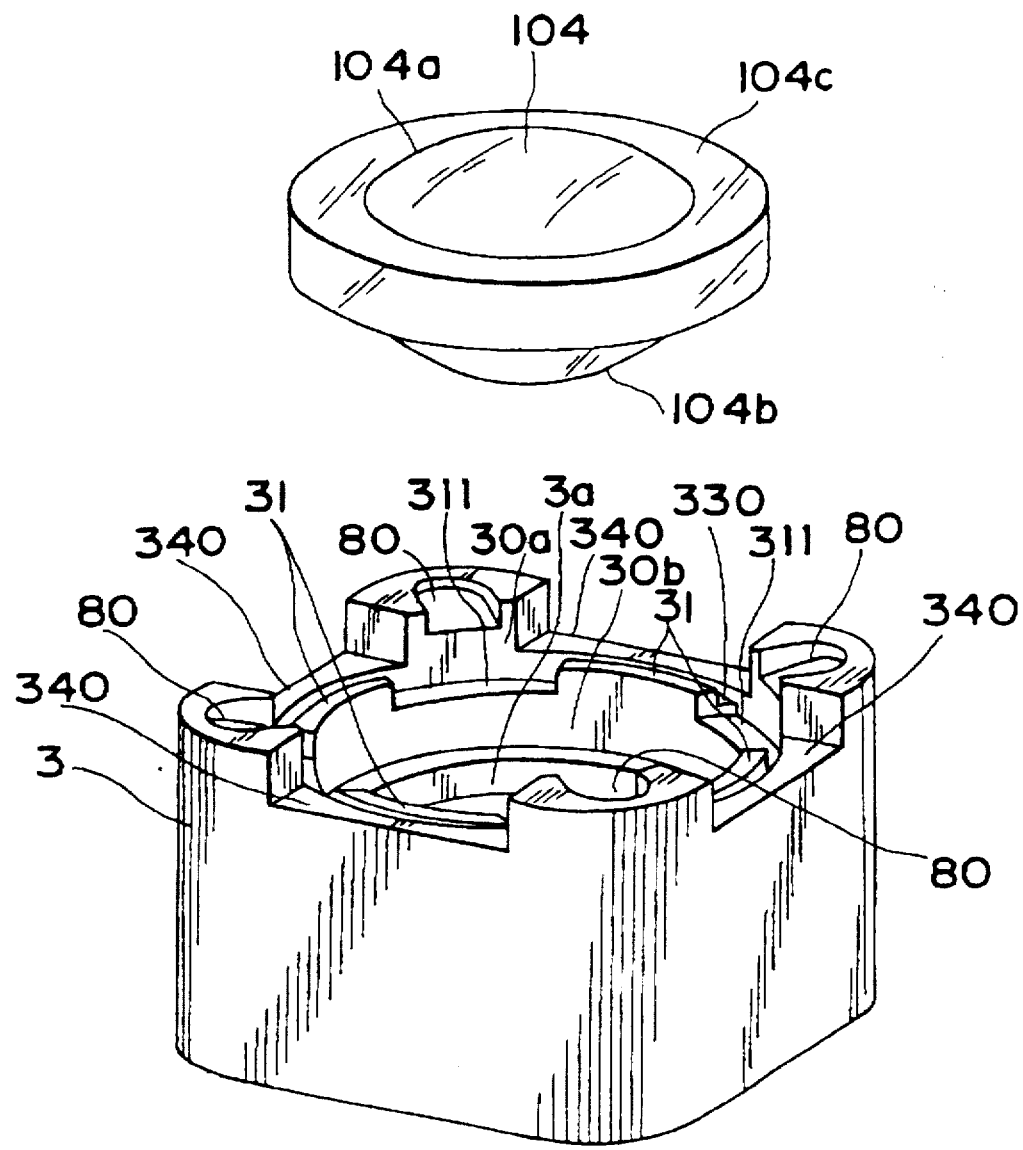
FIG. 13 is a perspective view of the objective lens holding structure for an optical pick-up according to the seventh embodiment of the present invention.
Figure 14:
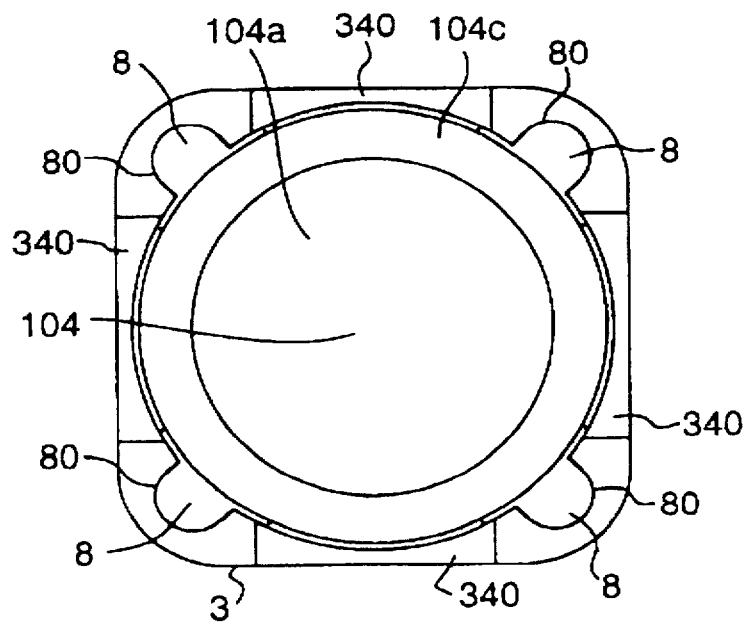
FIG. 14 is a top view of the objective lens holding structure shown in FIG. 13.

Note that components providing the same function as in the prior art example shown in FIGS. 24 and 25, and the preceding embodiments shown in FIGS. 13–14 are identified by like references.

As in the preceding embodiment shown in FIGS. 13 and 14, split recess 340 separates the side wall of the lens insertion hole 30a into plural wall sections; adhesive channels 80 sloping downward and inward toward the lens insertion hole 30a are provided for adhesive 8 injection; an annular member 31 determines the height position of the small objective lens 104; and recesses 300 collect any excess adhesive 8 overflow. Note that the annular channel 330 provides an escape area for any edge burrs on the small objective lens 104. What differs in this embodiment is that the recesses 300 are formed on the annular member 31, and the width in the circumferential direction is greater than the width of the wall members of the lens insertion hole 30a positioned thereabove.

The method of positioning and fastening the small objective lens 104 in the lens holder 3 is described next.

When the small objective lens 104 is inserted to the lens insertion hole 30a, the bottom lens surface 104b enters the center hole 30b, the bottom of the outer ring 104c contacts the top of the annular member 31, and the position of the small objective lens 104 to the lens holder 3 is thus determined by the lens insertion hole 30a and the annular member 31. The adhesive 8 is then injected to the adhesive channels 80 to bond the small objective lens 104 in place.

With this configuration, the adhesive 8 injected to the adhesive channels 80 spreads downward and circumferentially through the gap between the outer ring 104c and the lens insertion hole 30a. The spread of any adhesive 8 in the circumferential direction is limited by the split recess 340, and unnecessary expansion of the adhesion area is thus prevented. Excess adhesive 8 flowing toward the bottom of the small objective lens 104 also reliably collects in the recesses 300 because the circumferential width of the recesses 300 is greater than that of the wall sections of the lens insertion hole 30a.

With the configuration of an objective lens holding structure for an optical pick-up according to the present embodiment thus described, the side wall of the lens insertion hole 30a in the lens holder 3 is separated into plural wall sections by the split recess 340, and adhesive channels 80 sloping downward and inward toward the lens insertion hole 30a are provided above these wall sections. Recesses 300 having a greater width in the circumferential direction than the width of the wall members are also formed in the top of the annular member 31, which is formed in the bottom of the lens insertion hole 30a, at positions corresponding to the adhesive channels 80. By applying adhesive 8 to the adhesive channels 80 to bond the small objective lens 104 to the lens holder 3, excess adhesive 8 reliably collects in the recesses 300, and overflow of excess adhesive 8 below the outer ring 104c can be prevented. Thus, in addition to the effects of the preceding embodiments, adhesion reliability and stability can be improved.

Figure 18:
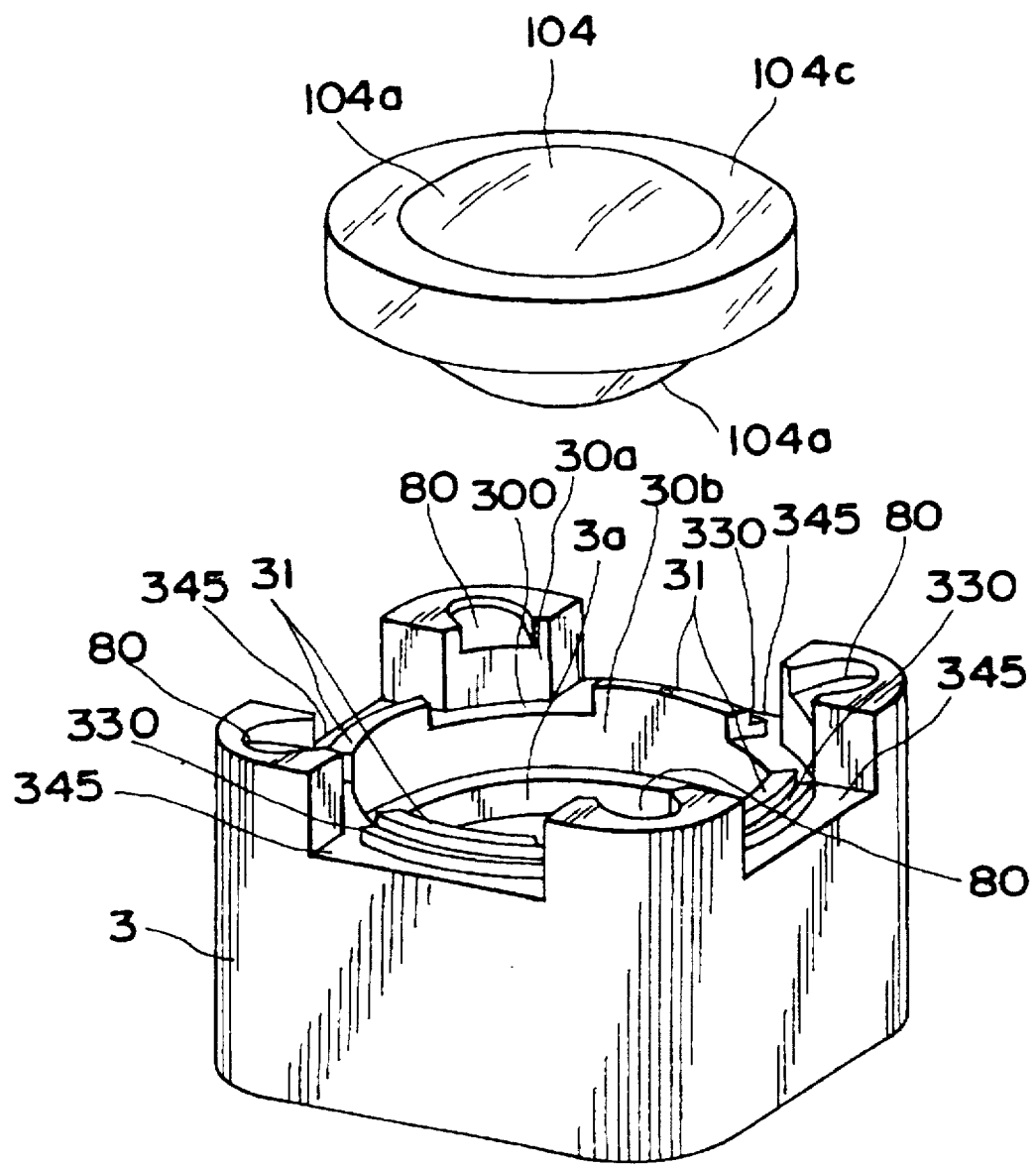
FIG. 18 is an exploded perspective view of the objective lens holding structure for an optical pick-up according to the ninth embodiment of the present invention.
Figure 19:
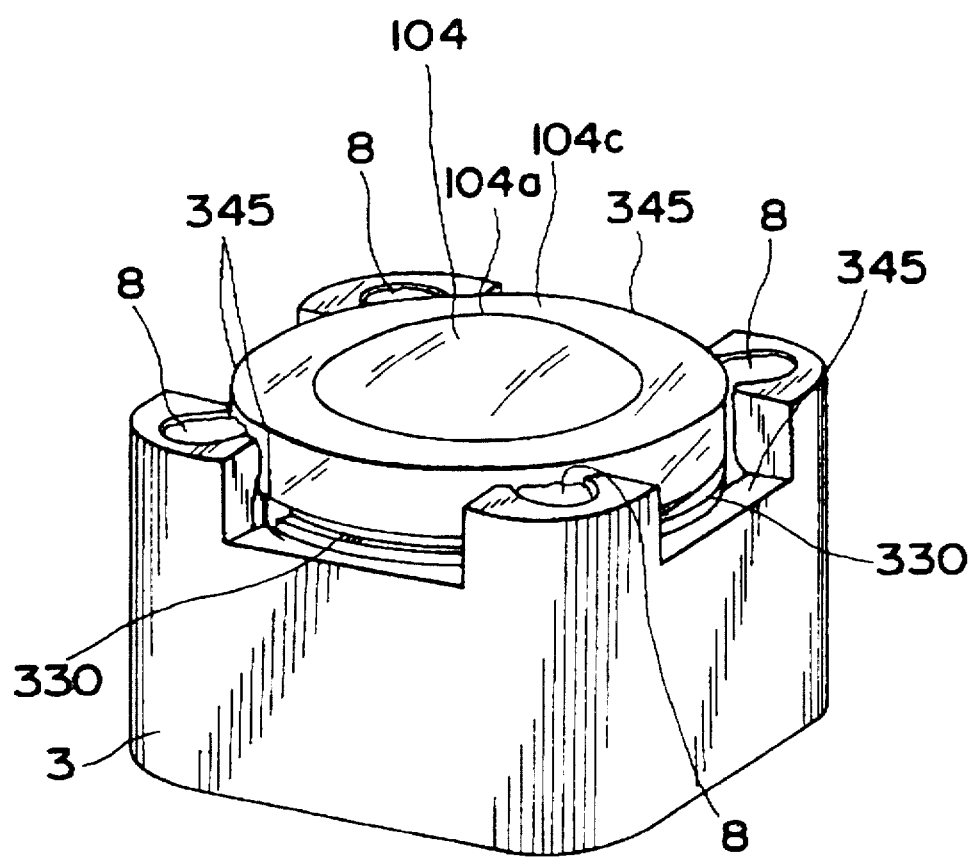
FIG. 19 is a perspective view of the objective lens holding structure.

Embodiment 9:

The ninth embodiment of the present invention is described below with reference to the accompanying FIG. 18, an exploded perspective view of the objective lens holding structure for an optical pick-up according to the ninth embodiment of the present invention, and FIG. 19, a perspective view of the objective lens holding structure shown in FIG. 18.

Figure 15:
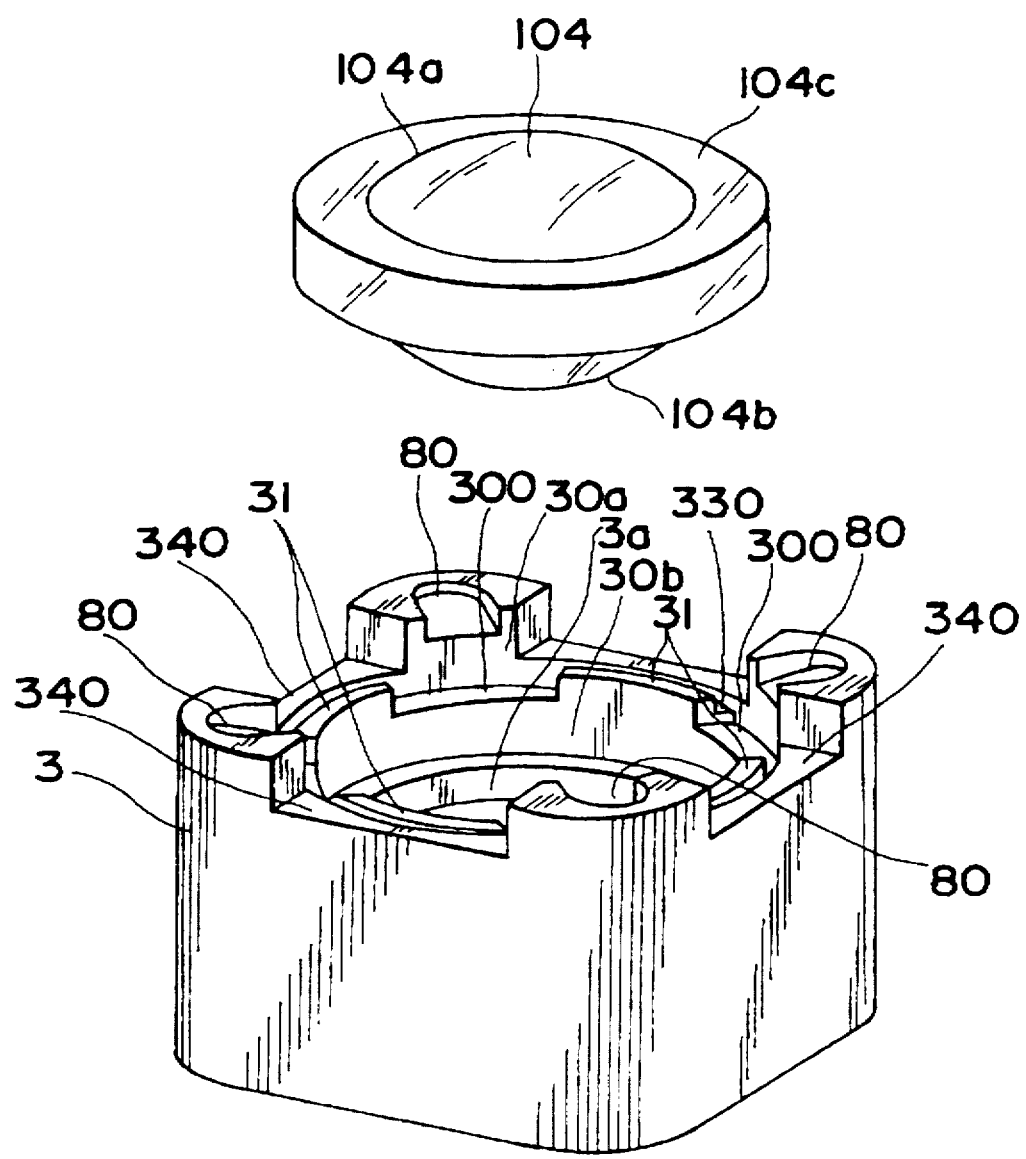
FIG. 15 is an exploded perspective view of the objective lens holding structure for an optical pick-up according to the eighth embodiment of the present invention.
Figure 16:
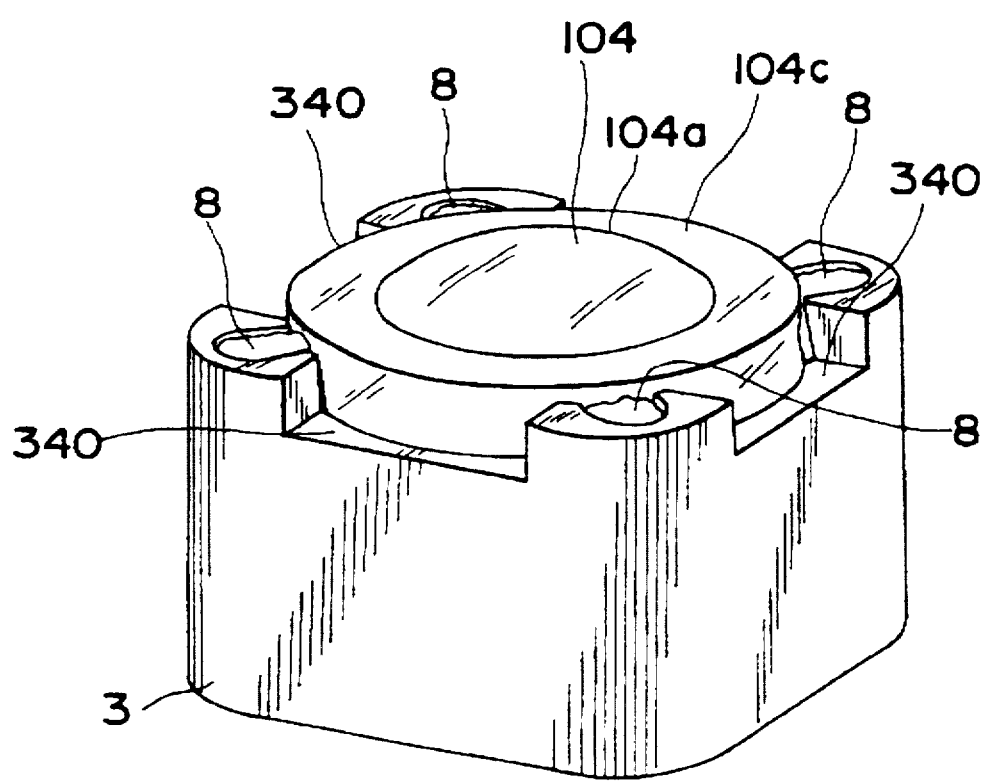
FIG. 16 is a perspective view of the objective lens holding structure shown in FIG. 15.
Figure 17:
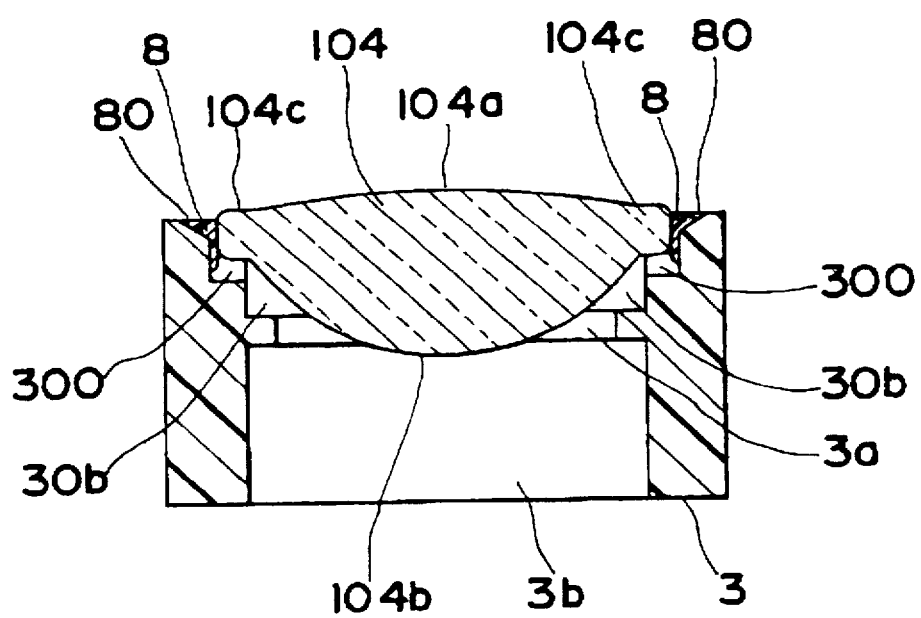
FIG. 17 is a side cross-sectional view of the objective lens holding structure.

Note that components providing the same function as in the prior art example shown in FIGS. 24 and 25, and the preceding embodiments shown in FIGS. 15–17 are identified by like references.

What differs between this embodiment and that shown in FIGS. 15–17 is the provision of a split recess 345 dividing the side wall of the lens insertion hole 30a into plural segments where the bottom of the split recess 345 is lower than the top of the annular member 31.

The method of positioning and fastening the small objective lens 104 in the lens holder 3 is described next.

When the small objective lens 104 is inserted to the lens insertion hole 30a, the bottom lens surface 104b enters the center hole 30b, the bottom of the outer ring 104c contacts the top of the annular member 31, and the position of the small objective lens 104 to the lens holder 3 is thus determined by the lens insertion hole 30a and the annular member 31. The adhesive 8 is then injected to the adhesive channels 80 to bond the small objective lens 104 in place.

With this configuration, the adhesive 8 injected to the adhesive channels 80 spreads downward and circumferentially through the gap between the outer ring 104c and the lens insertion hole 30a. The spread of any adhesive 8 in the circumferential direction is limited by the split recess 345, and unnecessary circumferential spreading of the adhesion area is thus prevented. Because the bottom of the split recess 345 is lower than the top of the annular member 31, any adhesive 8 leaking along the side wall of the outer ring 104c can also be collected in the bottom of the split recess 345. Excess adhesive 8 flowing toward the bottom of the small objective lens 104 also collects in the recesses 300.

By thus providing a split recess 345 having a bottom below the top of the annular member 31 in an objective lens holding structure for an optical pick-up according to the present embodiment thus described, any adhesive 8 travelling along the outer ring 104c and leaking from the side walls can be reliably collected and prevented from flowing to the lens surface. Therefore, in addition to the effects of the preceding embodiments, penetration of the adhesive 8 between the outer ring 104c and the annular member 31 can be prevented.

Figure 20:
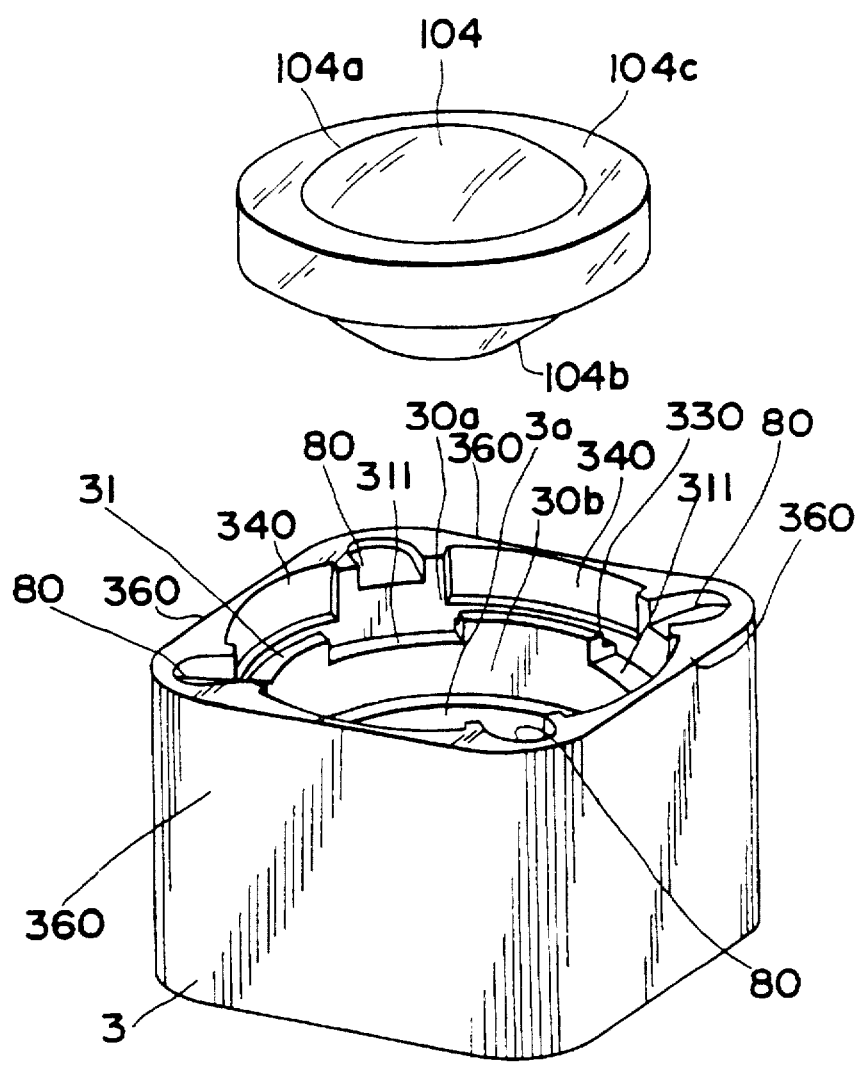
FIG. 20 is a perspective view of the objective lens holding structure for an optical pick-up according to the tenth embodiment of the present invention.
Figure 21:
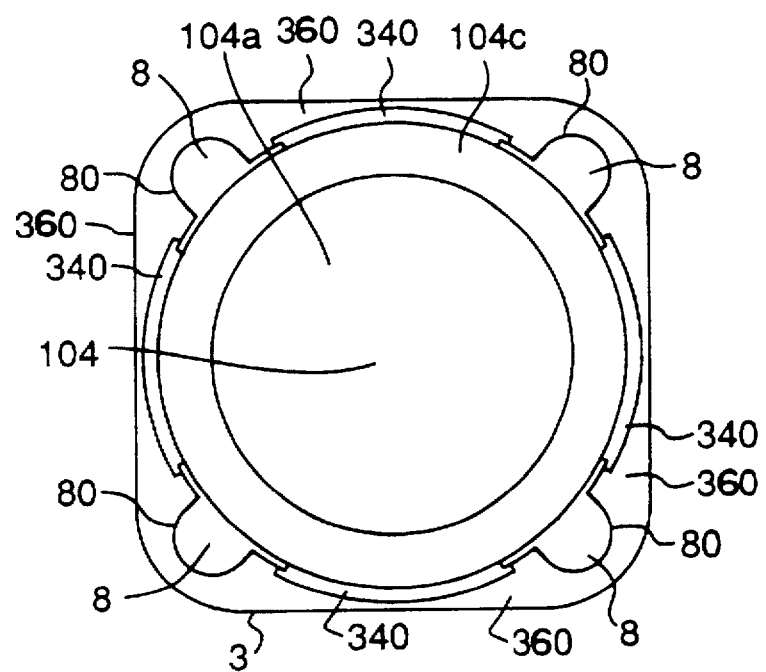
FIG. 21 is a top view of the objective lens holding structure shown in FIG. 20.

Embodiment 10:

The tenth embodiment of the present invention is described below with reference to the accompanying FIG. 20, an exploded perspective view of the objective lens holding structure for an optical pick-up according to the tenth embodiment of the present invention, and FIG. 21, a top view of the same.

Note that components providing the same function as in the prior art example shown in FIGS. 24 and 25, and the preceding embodiments shown in FIGS. 1–14, are identified by like references.

As in the preceding embodiment shown in FIGS. 13 and 14, adhesive channels 80 sloping downward and inward toward the lens insertion hole 30a are provided in the top of the lens holder 3 at the four corners thereof for injecting adhesive 8; recesses 311 are formed in the top of the annular member 31 at positions corresponding to the adhesive channels 80 with the bottoms thereof sloping away from the center hole 30b in the direction of the outside circumference; and an annular channel 330 is provided around the circumference of the annular member 31. What differs in this embodiment is that a split recess 340 is provided outside the lens insertion hole 30a and in the top of the lens holder 3 to separate the adhesive channels 80 at the four corners, and an outside (side) wall member 360 is provided outside the split recess 340.

The method of positioning and fastening the small objective lens 104 in the lens holder 3 is described next.

When the small objective lens 104 is inserted to the lens insertion hole 30a, the bottom lens surface 104b enters the center hole 30b, the bottom of the outer ring 104c contacts the top of the annular member 31, and the position of the small objective lens 104 to the lens holder 3 is thus determined by the lens insertion hole 30a and the annular member 31. The adhesive 8 is then injected to the adhesive channels 80 to bond the small objective lens 104 in place.

With this configuration, the adhesive 8 injected to the adhesive channels 80 spreads through the gap between the outer ring 104c and the lens insertion hole 30a. The wall area of the lens insertion hole 30a contacting the side wall of the outer ring 104c is limited by the split recess 340, and the diffusion area (adhesion area) of the adhesive 8 is limited to the divided wall sections of the lens insertion hole 30a.

The rigidity of the lens holder 3 is also increased because a wall member 360 is also provided outside the split recess 340.

Therefore, in addition to the effects obtained by the first to fourth embodiments and the sixth and seventh embodiments above, the rigidity of the lens holder 3 can be increased and stable servo characteristics can be achieved by providing a split recess 340 in the top of the lens holder 3 outside the lens insertion hole 30a to separate the adhesive channels 80 at the four corners, and providing a wall member 360 on the outside circumference of the split recess 340.

Figure 22:
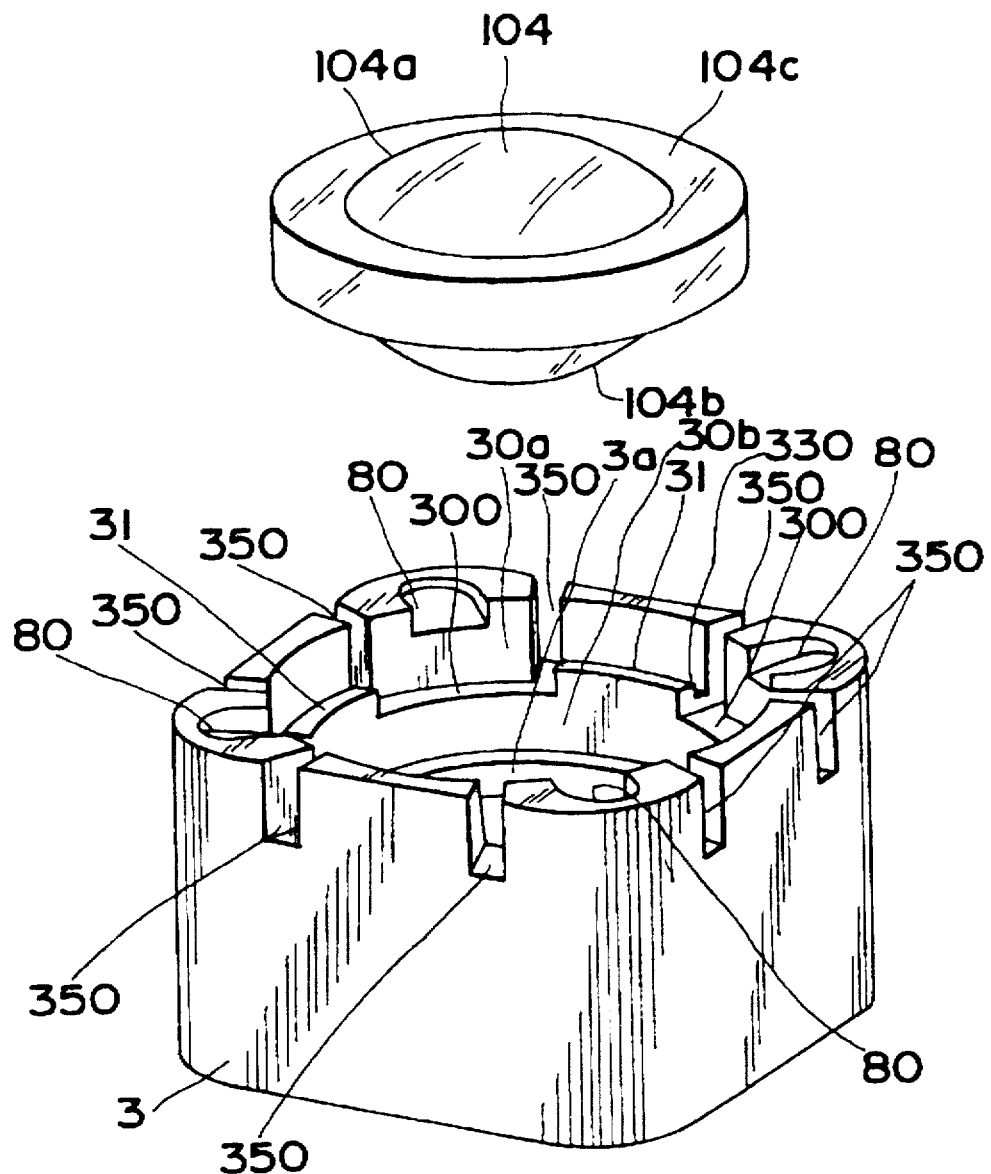
FIG. 22 is an exploded perspective view of the objective lens holding structure for an optical pick-up according to the eleventh embodiment of the present invention.
Figure 23:
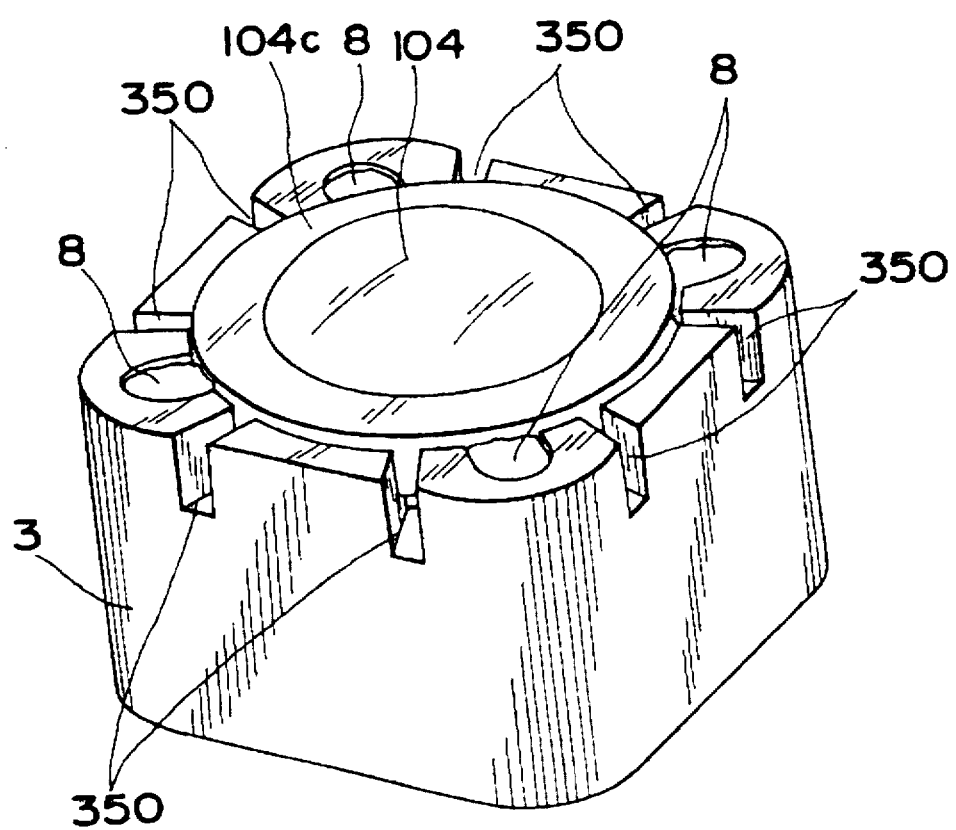
FIG. 23 is a perspective view of the objective lens holding structure.

Embodiment 11:

The eleventh embodiment of the present invention is described below with reference to the accompanying FIG. 22, an exploded perspective view of the objective lens holding structure for an optical pick-up according to the eleventh embodiment of the present invention, and FIG. 23, a perspective view of said objective lens holding structure.

Note that components providing the same function as in the prior art example shown in FIGS. 24 and 25, and the preceding embodiments shown in FIGS. 15–17 and FIGS. 20 and 21 are identified by like references.

What differs in this embodiment from those shown in FIGS. 15–17 and FIGS. 20 and 21 is that the lens insertion hole 30a is interrupted by vertical slots 350 of which the bottom is lower than the top of the annular member 31, and side wall members contacting the outside circumference of the outer ring 104c are thus also formed at positions other than the adhesive channels 80 while providing an adhesive drain channel through the side walls to the outside.

The method of positioning and fastening the small objective lens 104 in the lens holder 3 is described next.

When the small objective lens 104 is inserted to the lens insertion hole 30a, the bottom lens surface 104b enters the center hole 30b, the bottom of the outer ring 104c contacts the top of the annular member 31, and the position of the small objective lens 104 to the lens holder 3 is thus determined by the lens insertion hole 30a and the annular member 31. The adhesive 8 is then injected to the adhesive channels 80 to bond the small objective lens 104 in place.

With this configuration, the adhesive 8 injected to the adhesive channels 80 spreads downward and circumferentially through the gap between the outer ring 104c and the lens insertion hole 30a. The spread of any adhesive 8 in the circumferential direction is limited by the vertical slots 350, and unnecessary expansion of the adhesion area is thus prevented. Because the bottom of the vertical slots 350 is also lower than the top of the annular member 31, any adhesive 8 migrating along the side wall of the outer ring 104c and flowing over the side wall can also be collected in the vertical slots 350. Because side walls are also formed for the lens insertion hole 30a at points other than the adhesive channels 80, the wall area used to position the small objective lens 104 can be increased. Excess adhesive 8 flowing toward the bottom of the small objective lens 104 also flows into the recesses 300.

Therefore, in addition to the effects obtained by the eighth to tenth embodiments above, the small objective lens 104 can be consistently positioned because the contact area to the sides of the small objective lens 104 can be increased by dividing the side wall of the lens insertion hole 30a into plural segments by means of narrow vertical slots 350 of which the bottom is lower than the top of the annular member 31, and side wall members can thus be formed separately from the wall sections in which the adhesive channels 80 are disposed.

Effects of the invention

With an objective lens holding structure for an optical pick-up according to the present invention as thus described, an objective lens having an outer ring with a flat surface around the outside circumference of the lens curvature is inserted to a lens holder comprising a hole to which the objective lens is inserted, and comprising at the bottom of said hole an annular member comprising plural recesses and having an inside diameter greater than the diameter of the inside circumference of said outer ring. The objective lens is thus positioned by the side wall of the hole and this annular member, and the outer ring and lens holder are bonded together with adhesive applied to the positions at which said recesses are formed. It is therefore possible to provide an objective lens holding structure for an optical pick-up whereby excess adhesive does not flow to the bottom surface of the objective lens, and the objective lens is resistant to distortion and lens aberrations introduced by adhesive shrinkage even when the objective lens is a small lens having a small outer ring buffering adhesion distortions. Said objective lens holding structure therefore also offers excellent reliability and does not contribute to optical aberrations in the optical pick-up.

It is also possible to reduce the size of the lens holder, and to provide a compact, low-profile optical pick-up and optical disk device, because a small objective lens can be used.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An objective lens holding structure for an optical pick-up, comprising at least:

an objective lens for focusing a light beam, said objective lens having a curvature and having an outer ring with a flat surface around the outside circumference of the lens curvature; and a lens holder having a hole into which the objective lens is inserted; and at the bottom of said hole, an annular member having plural recesses and having an inside diameter greater than the diameter of the inside circumference of said outer ring, wherein the objective lens is inserted into said hole and is supported by the annular member, and wherein the outer ring is fastened to the lens holder with adhesive.

2. An objective lens holding structure for an optical pick-up, comprising at least:

an objective lens for focusing a light beam, said objective lens having a curvature and having an outer ring with a flat surface around the outside circumference of the lens curvature;

a lens holder having a hole into which the objective lens is inserted; and an annular member at the bottom of said hole into which the objective lens is inserted, said annular member having an inside diameter at the bottom of said hole that is greater than the diameter of the inside circumference of said outer ring, and having plural recesses disposed on said annular member, wherein said lens holder has adhesive channels around said hole disposed on said lens holder at positions corresponding to said recesses, wherein the objective lens is inserted into said hole and supported by the annular member, wherein adhesive is injected in said adhesive channels, and wherein the objective lens is bonded to the lens holder.

3. An objective lens holding structure for an optical pick-up, comprising at least:

an objective lens for focusing a light beam, said objective lens having a curvature and having an outer ring with a flat surface around the outside circumference of the lens curvature;

a lens holder having a hole into which the objective lens is inserted; and an annular member at the bottom of said hole into which the objective lens is inserted, said annular member having an inside diameter at the bottom of said hole that is greater than the diameter of the inside circumference of said outer ring, and having plural recesses disposed on said annular member, wherein said lens holder has adhesive channels around said hole disposed on said lens holder at positions corresponding to said recesses, wherein said adhesive channels have a channel width in the circumferential direction that is less than that of said recesses, and wherein the objective lens is inserted into said hole and supported by the annular member, wherein adhesive is injected in said adhesive channels, and wherein the objective lens is bonded to the lens holder.

4. An objective lens holding structure for an optical pick-up according to claim 2 or claim 3, further comprising, an outside wall at the outside circumference of the adhesive channels disposed in the top of the lens holder hole.

5. An objective lens holding structure for an optical pick-up according to claim 2 or claim 3, wherein the top of the lens holder hole adhesive channels have a slope declining towards the inside bottom center of the hole.

6. An objective lens holding structure for an optical pick-up, comprising at least:

an objective lens for focusing a light beam, said objective lens having a curvature and having an outer ring with a flat surface around the outside circumference of the lens curvature; and a lens holder having a hole into which the objective lens is inserted; and at the bottom of said hole, an annular member having an inside diameter greater than the diameter of the inside circumference of said outer ring and having plural recesses of which the floor is inclined toward the outside circumference, and wherein the objective lens is inserted into said hole and is supported by the annular member, and wherein the outer ring is fastened to the lens holder with adhesive.

7. An objective lens holding structure for an optical pick-up, comprising at least:

an objective lens for focusing a light beam, said objective lens having a curvature and having an outer ring with a flat surface around the outside circumference of the lens curvature;

a lens holder having a hole into which the objective lens is inserted; and an annular member at the bottom of said hole into which the objective lens is inserted, said annular member having an inside diameter at the bottom of said hole that is greater than the diameter of the inside circumference of said outer ring, and having plural recesses on a top of said annular member, wherein said lens holder has horizontal slots for bleeding adhesive to the outside formed in the outside circumference wall thereof at positions corresponding to said recesses;

wherein the objective lens is inserted into said hole and supported by the annular member, and wherein the outer ring is bonded with the lens holder by means of adhesive on the recesses.

8. An objective lens holding structure for an optical pick-up, comprising at least:

an objective lens for focusing a light beam, said objective lens having a curvature and having an outer ring with a flat surface around the outside circumference of the lens curvature;

a lens holder having a hole into which the objective lens is inserted; and an annular member at the bottom of said hole into which the objective lens is inserted, said annular member having an inside diameter at the bottom of said hole that is greater than the diameter of the inside circumference of said outer ring, and having plural recesses disposed on said annular member, wherein said lens holder has an annular channel around the outside circumference of said annular member;

wherein the objective lens is inserted into said hole and supported by the annular member, and wherein the outer ring is bonded with the lens holder by means of adhesive on the recesses.

9. An objective lens holding structure for an optical pick-up, comprising at least:

an objective lens for focusing a light beam, said objective lens having a curvature and having an outer ring with a flat surface around the outside circumference of the lens curvature; and a lens holder having a hole into which the objective lens is inserted, wherein a split recess divides a side wall of said hole circumferentially into plural wall sections; and an annular member at the bottom of said hole having an inside diameter that is greater than the diameter of the inside circumference of said outer ring, and plural recesses disposed on said annular member, wherein the objective lens is inserted into said hole and supported by the annular member, and wherein the outer ring is bonded with the lens holder by means of adhesive on the recesses.

10. An objective lens holding structure for an optical pick-up according to claim 9, wherein the width in the circumferential direction of the recesses disposed in the annular member is greater than the width in the circumferential direction of the wall sections positioned above the recesses.

11. An objective lens holding structure for an optical pick-up according to claim 9 or 10, wherein the bottom of the split recess is lower than the top of the annular member disposed in the bottom of said hole.

12. An objective lens holding structure for an optical pick-up according to claim 9, or claim 10, wherein an annular channel is provided in the outside circumference part of the annular member.

13. An objective lens holding structure for an optical pick-up according to claim 8 or claim 9, wherein narrow adhesive channels are provided around the lens holder hole above the recesses in the annular member, and wherein said adhesive channels have a channel width in the circumferential direction that is less than that of said recesses.

14. An objective lens holding structure for an optical pick-up, comprising at least:

an objective lens for focusing a light beam, said objective lens having a curvature and having an outer ring with a flat surface around the outside circumference of the lens curvature; and a lens holder having a hole into which the objective lens is inserted, wherein a split recess divides a side wall of said hole circumferentially into plural sections, and wherein the side wall is disposed on the outside circumference of the split recess; and an annular member at the bottom of said hole having an inside diameter that is greater than the diameter of the inside circumference of said outer ring, wherein the objective lens is inserted into said hole and supported by the annular member, and wherein the outer ring is bonded with the lens holder by means of adhesive.

15. An objective lens holding structure for an optical pick-up according to any of claims 9, 10 and 14, wherein said side wall disposed on the outside circumference of the split recess is interrupted by vertical slots of which the bottom is lower than the top of the annular member, and wherein a side of the outer ring of the objective lens contacts the side wall at places other than bonding points between the objective lens and lens holder.

* * * * *